(12) United States Patent
Tsukada et al.

(10) Patent No.: US 11,929,342 B2
(45) Date of Patent: Mar. 12, 2024

(54) SEMICONDUCTOR DEVICE WITH LEADS HAVING STEP SURFACES

(71) Applicant: SHINKO ELECTRIC INDUSTRIES CO., LTD., Nagano (JP)

(72) Inventors: Futoshi Tsukada, Nagano (JP); Yukinori Hatori, Nagano (JP); Yoshiyuki Sawamura, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 108 days.

(21) Appl. No.: 17/082,531

(22) Filed: Oct. 28, 2020

(65) Prior Publication Data
US 2021/0134754 A1 May 6, 2021

(30) Foreign Application Priority Data

Oct. 30, 2019 (JP) .................................. 2019-196951
Jun. 1, 2020 (JP) .................................. 2020-095751

(51) Int. Cl.
*H01L 23/00* (2006.01)
*H01L 23/29* (2006.01)
(Continued)

(52) U.S. Cl.
CPC ............ *H01L 24/45* (2013.01); *H01L 23/295* (2013.01); *H01L 23/36* (2013.01); *H01L 23/49861* (2013.01); *H01L 23/5386* (2013.01)

(58) Field of Classification Search
CPC ....... H01L 2924/00012; H01L 23/4334; H01L 23/49816; H01L 23/5386; H01L 23/49568;
(Continued)

(56) References Cited

U.S. PATENT DOCUMENTS

| | | | |
|---|---|---|---|
| 6,791,195 B2 * | 9/2004 | Urushima | ............. H01L 21/563 |
| | | | 257/E21.503 |
| 8,207,607 B2 * | 6/2012 | Yamagishi | ............. H01L 24/83 |
| | | | 257/E21.705 |

(Continued)

FOREIGN PATENT DOCUMENTS

| | | | | |
|---|---|---|---|---|
| CN | 105144373 A | * | 12/2015 | ....... H01L 23/49568 |
| CN | 105643855 A | | 6/2016 | |

(Continued)

OTHER PUBLICATIONS

Taiwanese Office Action dated Aug. 16, 2023 issued in corresponding Taiwanese application No. 109137027; English translation included (14 pages).

(Continued)

*Primary Examiner* — Didarul A Mazumder
*Assistant Examiner* — Gustavo G Ramallo
(74) *Attorney, Agent, or Firm* — Rankin, Hill & Clark LLP

(57) ABSTRACT

A semiconductor device includes: a lead frame that is formed of metal; a wiring substrate that is opposed to the lead frame; an electronic component that is disposed between the lead frame and the wiring substrate; a connection member that connects lead frame and the wiring substrate; and encapsulating resin that is filled between the lead frame and the wiring substrate and covers the electronic component and the connection member. The lead frame includes: a first surface opposed to the wiring substrate and covered by the encapsulating resin; a second surface located on a back side of the first surface and exposed from the encapsulating resin; and a side surface neighboring first surface or the second surface, at least a portion of the side surface exposed from the encapsulating resin.

20 Claims, 35 Drawing Sheets

(51) Int. Cl.
*H01L 23/36* (2006.01)
*H01L 23/498* (2006.01)
*H01L 23/538* (2006.01)

(58) Field of Classification Search
CPC ... H01L 24/45; H01L 23/36; H01L 23/49861; H01L 23/49811; H01L 23/145; H01L 25/0652; H01L 23/295; H01L 23/5389; H01L 23/49517; H01L 23/49531; H01L 23/49582; H01L 2924/181; H01L 2225/06572; H01L 2224/32245; H01L 2224/73204; H01L 2225/06517; H01L 2224/16225; H01L 2924/19107; H01L 2225/06589; H01L 2924/19105; H01L 2924/19106; H01L 23/48–49894
USPC .......................................................... 257/666
See application file for complete search history.

(56) References Cited

U.S. PATENT DOCUMENTS

| | | | | |
|---|---|---|---|---|
| 8,485,418 | B2 * | 7/2013 | Eldridge | B23K 20/004 228/180.5 |
| 9,972,558 | B1 * | 5/2018 | Talledo | H01L 21/4825 |
| 10,211,067 | B1 * | 2/2019 | Lin | H01L 21/4857 |
| 2005/0047094 | A1 | 3/2005 | Hsu et al. | |
| 2007/0069345 | A1 * | 3/2007 | Liu | H01L 23/4334 257/667 |
| 2011/0074016 | A1 * | 3/2011 | Narita | H01L 21/4821 257/737 |
| 2012/0104577 | A1 * | 5/2012 | Fukumura | H01L 23/4951 257/666 |
| 2015/0060920 | A1 * | 3/2015 | Horikawa | H05K 1/188 361/761 |
| 2015/0078711 | A1 * | 3/2015 | Ootorii | G02B 6/4268 385/88 |
| 2017/0025329 | A1 | 1/2017 | Ishibashi et al. | |
| 2017/0117210 | A1 * | 4/2017 | Hayashi | H01L 23/3157 |
| 2017/0271233 | A1 * | 9/2017 | Imai | H01L 23/3677 |
| 2018/0040543 | A1 | 2/2018 | Ishibashi et al. | |
| 2018/0166016 | A1 * | 6/2018 | Ootorii | G09G 3/30 |

FOREIGN PATENT DOCUMENTS

| | | | | |
|---|---|---|---|---|
| CN | 108293298 | * | 7/2018 | ............. H01R 13/03 |
| CN | 209544331 U | * | 10/2019 | ........ H01L 2924/181 |
| CN | 209544331 U | * | 10/2019 | ............ H01L 23/195 |
| DE | 202018104347 U1 | * | 8/2018 | ............. H01L 23/48 |
| JP | 2017-028152 A | | 2/2017 | |
| JP | 2017174849 A | * | 9/2017 | ............. H01L 23/29 |
| JP | 2018-190942 A | | 11/2018 | |
| JP | 6455932 B2 | * | 1/2019 | ....... H01L 2924/181 |
| TW | 200509337 A | | 3/2005 | |
| WO | 2007/069606 | | 5/2009 | |
| WO | 2011092871 A1 | * | 8/2011 | ............. H01L 33/62 |

OTHER PUBLICATIONS

Japanese Office Action, dated Sep. 19, 2023, Application No. 2020-095751; English translation included, 6 pages.

\* cited by examiner

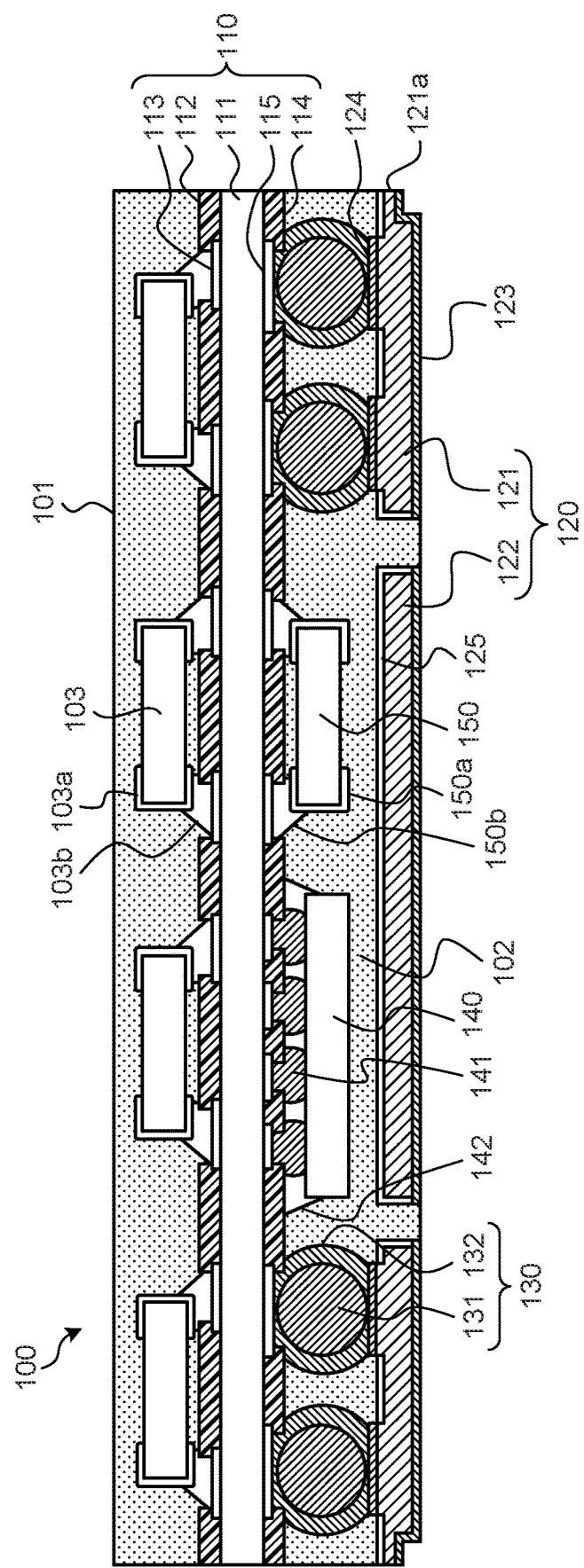

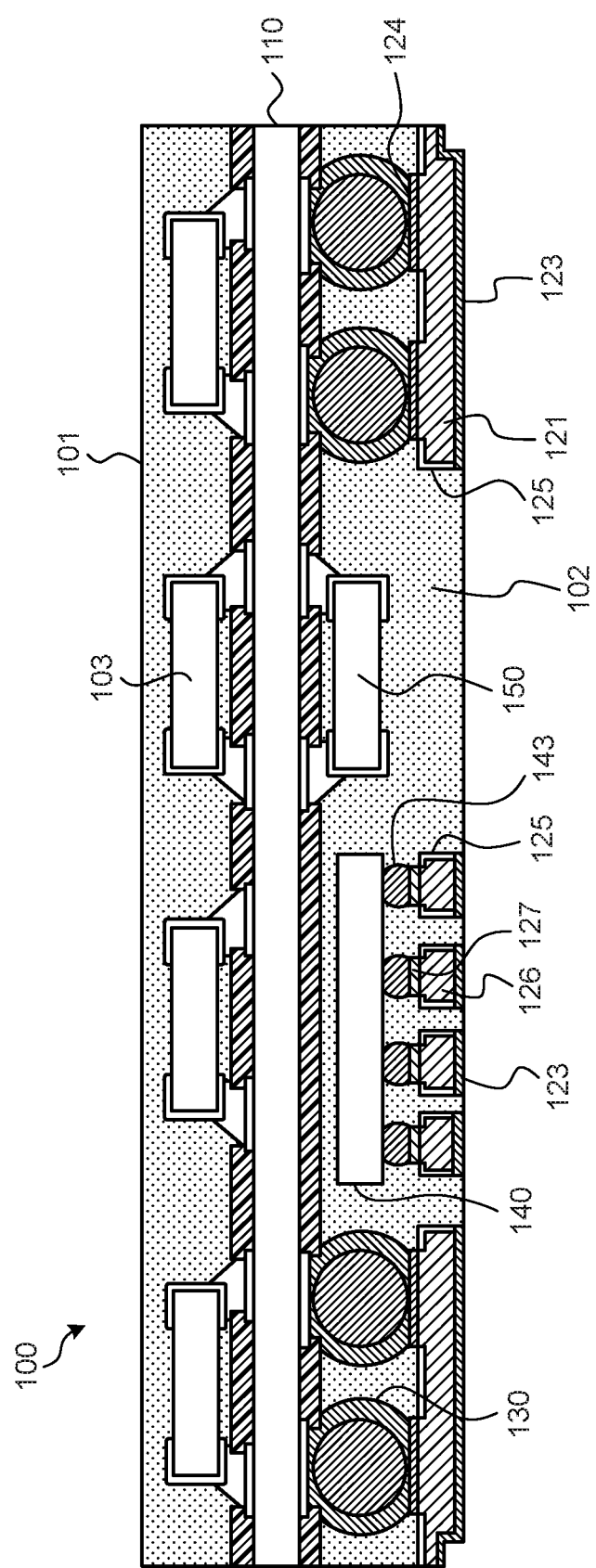

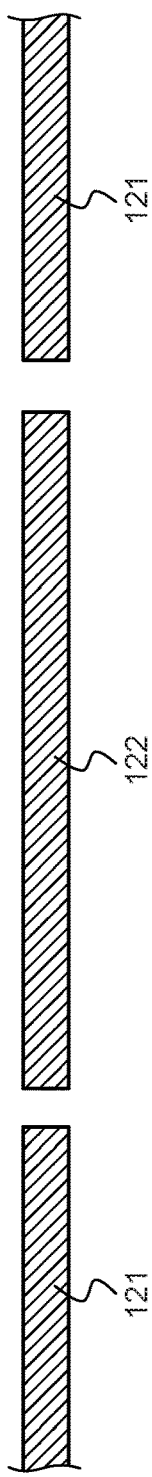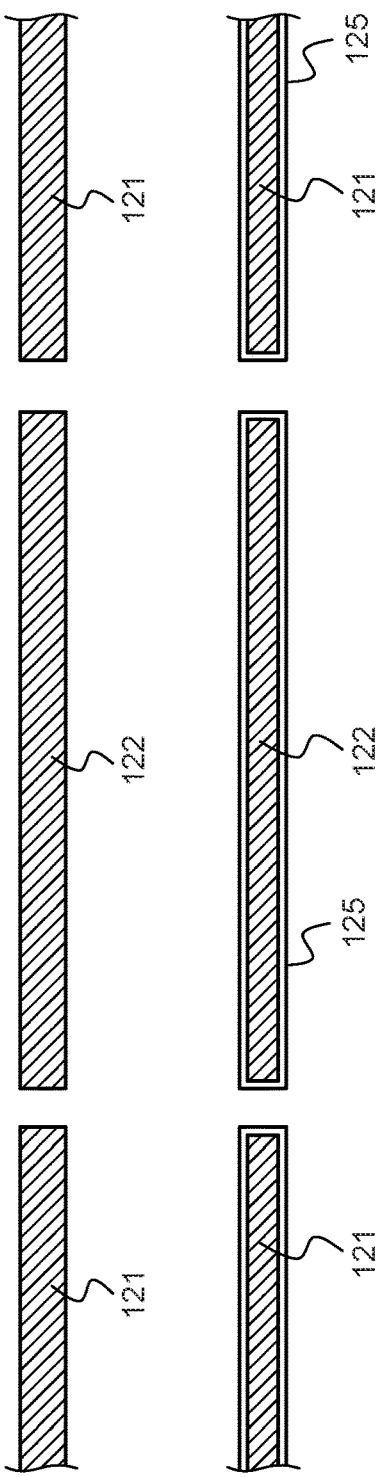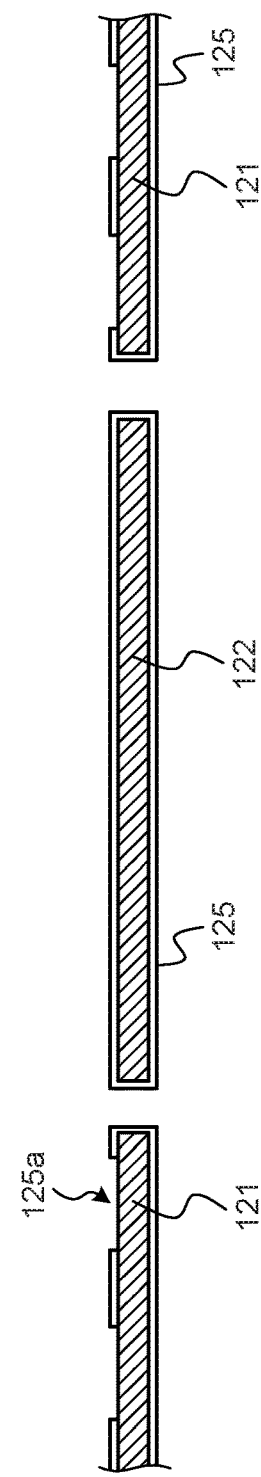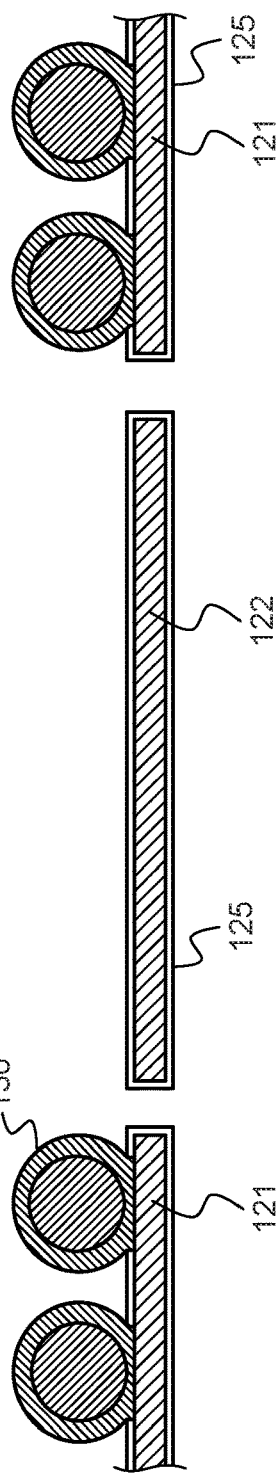

SEMICONDUCTOR DEVICE WITH LEADS HAVING STEP SURFACES

CROSS-REFERENCE TO RELATED APPLICATIONS

This application is based upon and claims the benefit of priority of the prior Japanese Patent Application No. 2019-196951, filed on Oct. 30, 2019 and Japanese Patent Application No. 2020-095751, filed on Jun. 1, 2020, the entire contents of which are incorporated herein by reference.

FIELD

The embodiments discussed herein are related to a semiconductor device and a method for manufacturing a semiconductor device.

BACKGROUND

In recent years, in order to realize high-density component mounting, for example, semiconductor devices, each of which has electronic components, such as integrated circuit (IC) chips, built-in inside substrates, have been attracting attention. Each of the above-mentioned semiconductor devices is configured in such a way that each of the semiconductor devices has, for example, two organic substrates and on one of the organic substrates, electronic components such as IC chips are mounted, and these electronic components are interposed between the one organic substrate and the other organic substrate. A space between the two organic substrates is filled with, for example, encapsulating resin.

As described above, the electronic components are built-in between the two organic substrates, thereby enabling three-dimensional component mounting in which the electronic components are mounted also on surfaces of the organic substrates on outer sides and allowing high density and miniaturization of the semiconductor device to be realized.

Patent Literature 1: WO 2007/069606 A1

However, the semiconductor device having the electronic components built-in has a problem in that it is difficult to sufficiently dissipate heat generated by the electronic components. In other words, since peripheries of the built-in electronic components are covered with the encapsulating resin whose thermal conductivity is low, the heat generated by the electronic components is conducted through the organic substrates from metal terminals whose thermal conductivity is high and is dissipated. However, areas of surface areas of the electronic components, which are occupied by the terminals, are small and a dissipation efficiency is not very high. Therefore, in particular, when amounts of heat generated by the electronic components are comparatively large, it is difficult to sufficiently dissipate the heat from the terminals of the electronic components.

SUMMARY

According to an aspect of an embodiment, a semiconductor device includes: a lead frame that is formed of metal; a wiring substrate that is opposed to the lead frame; an electronic component that is disposed between the lead frame and the wiring substrate; a connection member that connects the lead frame and the wiring substrate; and encapsulating resin that is filled between the lead frame and the wiring substrate and covers the electronic component and the connection member. The lead frame includes: a first surface opposed to the wiring substrate and covered by the encapsulating resin; a second surface located on a back side of the first surface and exposed from the encapsulating resin; and a side surface neighboring the first surface or the second surface, at least a portion of the side surface exposed from the encapsulating resin.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a schematic view illustrating a cross section of the semiconductor device according to the one embodiment;

FIG. 28 is a diagram illustrating yet another modified example of the semiconductor device;

FIGS. 29A to 29D are diagrams for explaining a method for manufacturing a lead frame according to another embodiment;

DESCRIPTION OF EMBODIMENTS

Hereinafter, one embodiment of a semiconductor device and a method for manufacturing a semiconductor device, which the present application discloses, will be described with reference to the accompanying drawings. It is to be noted that the present invention is not limited by this embodiment.

Figure 1A:
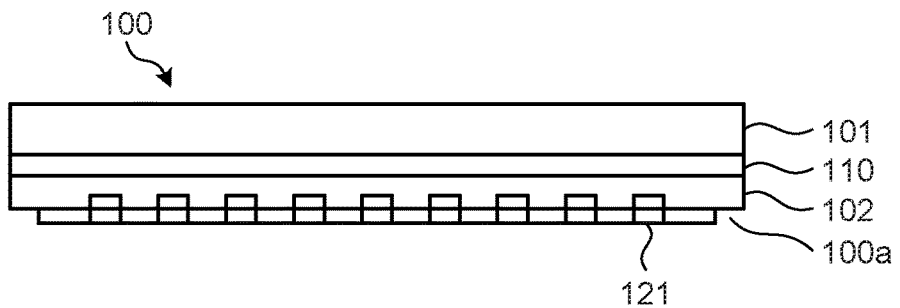
FIGS. 1A and 1B are diagrams illustrating appearance of a semiconductor device according to one embodiment.
Figure 1B:
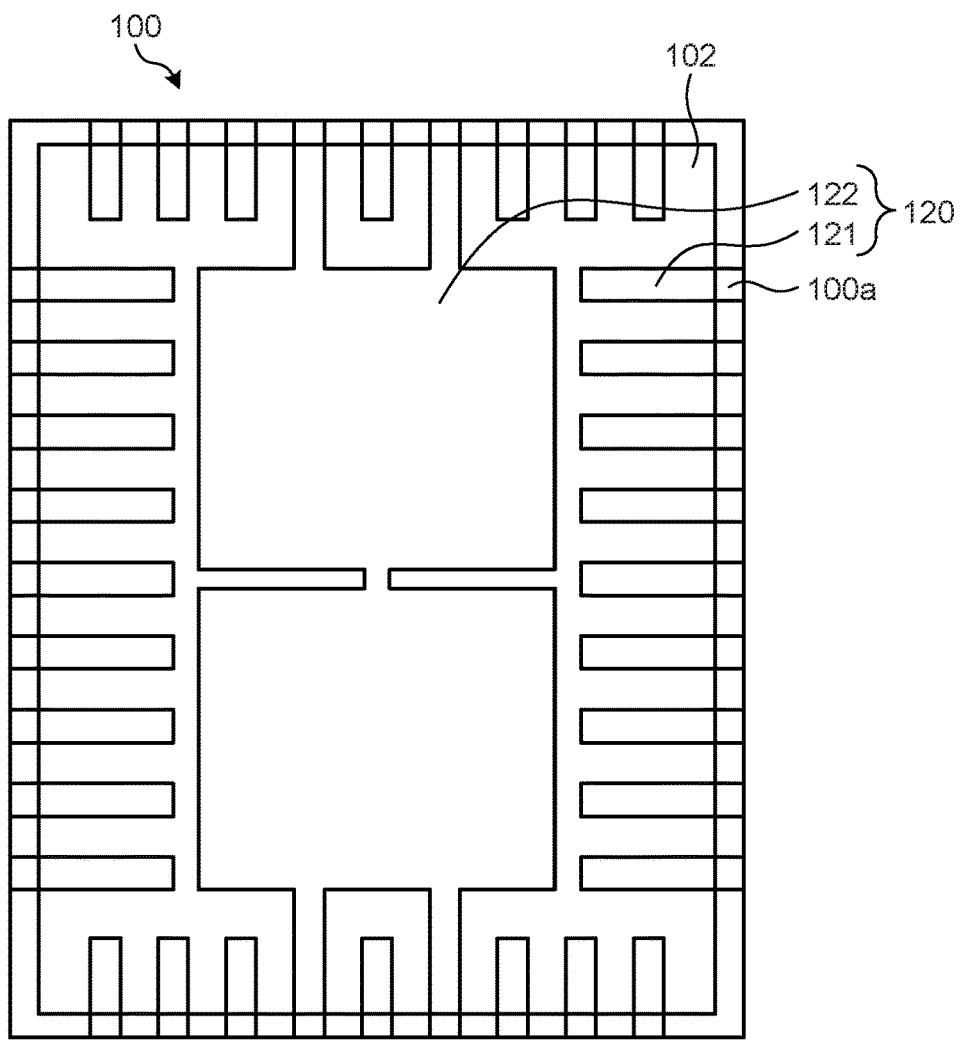

FIGS. 1A and 1B are diagrams illustrating appearance of a semiconductor device 100 according to the one embodiment. FIG. 1A is a side view of the semiconductor device 100 and FIG. 1B is a bottom view of the semiconductor device 100. It is to be noted that although in the description given below, upon mounting the semiconductor device 100 on a mounting substrate, a surface close to the mounting substrate is referred to as a "lower surface" and a surface remote from the mounting substrate is referred to as an "upper surface" and in accordance therewith, upper and lower directions are defined, the semiconductor device 100 may be manufactured and used, for example, in such a way as to be inverted upside down and may be manufactured and used in any posture.

The semiconductor device 100 illustrated in FIGS. 1A and 1B has a wiring substrate 110 and a lead frame 120 and has encapsulating resin 101 with which electronic components mounted on an upper surface of the wiring substrate 110 are covered and encapsulating resin 102 with which electronic components disposed in such a way as to be sandwiched between the wiring substrate 110 and the lead frame 120 are covered. Specifically, on the upper surface of the wiring substrate 110, for example, the electronic components such as capacitors and inductors are mounted, and these electronic components are covered with the encapsulating resin 101. In addition, on a lower surface of the wiring substrate 110, for example, electronic components such as IC chips are mounted and these electronic components are sandwiched between the wiring substrate 110 and the lead frame 120 and are covered with the encapsulating resin 102.

Each of the encapsulating resin 101 and the encapsulating resin 102 is, for example, thermosetting insulating resin such as epoxy resin, which contains an inorganic filler such as alumina, silica, aluminum nitride, or silicon carbide. It is to be noted that as to the encapsulating resin 102, a filling rate of the inorganic filler may be 70 wt % (weight percent) or more and 95 wt % or less. The filler is contained at the high filling rate as mentioned above, thereby allowing thermal conductivity of the encapsulating resin 102 to be enhanced. Furthermore, for example, a filler of metal such as silver may be contained in the encapsulating resin 102, and thermal dissipation thereof may be thereby enhanced. When the encapsulating resin 102 contains the metal filler, in order to prevent a short circuit of the electronic components, using a metal filler whose surface has undergone insulation treatment is suitable.

As illustrated in FIG. 1B, the lead frame 120 covered by the encapsulating resin 102 has leads 121 and a heat sink 122. On the lower surface of the semiconductor device 100, lower surfaces or the leads 121 and the heat sink 122 are exposed from the encapsulating resin 102. In addition, on a side surface of the semiconductor device 100, an end portion of a side of each of the leads 121 is exposed from the encapsulating resin 102. Whereas the leads 121 are electrically connected to a wiring layer of the wiring substrate 110, the heat sink 122 is formed in a position opposed to the electronic components mounted on the lower surface of the wiring substrate 110. Therefore, heat generated by the electronic component is conducted from the encapsulating resin 102 to the heat sink 122 and is efficiently dissipated from the heat sink 122 having a comparatively large area.

The semiconductor device 100 has a rectangular shape in a bottom view. Along four sides of the lower surface of the semiconductor device 100, the encapsulating resin 102 and the lead frame 120 are cut out and steps 100a are thereby formed. In the vicinity of the steps 100a, along the four sides of the lower surface of the semiconductor device 100, end portions of sides of the leads 121 are exposed from the encapsulating resin 102. It is to be noted that the end portions of the sides of the leads 121 may be exposed from the encapsulating resin 102 along two sides opposed to each other, instead of the four sides of the lower surface of the semiconductor device 100.

FIG. 2 is a schematic view illustrating a cross section of the semiconductor device 100 according to the one embodiment. As illustrated in FIG. 2, the wiring substrate 110 and the lead frame 120 are connected by connection members 130, whereby the semiconductor device 100 is configured. On the upper surface of the wiring substrate 110, electronic components 103 are mounted, and these electronic components 103 are encapsulated by the encapsulating resin 101. In addition, on the lower surface of the wiring substrate 110, an IC chip 140 and an electronic component 150 are mounted, and the IC chip 140 and the electronic component 150 are encapsulated by the encapsulating resin 102. Although herein, the IC chip 140 and the electronic component 150 are distinguished, the IC chip 140 is also a kind of the electronic component.

The wiring substrate 110 has a substrate 111, a solder resist layer 112, upper surface pads 113, a protective insulating layer 114, and lower surface pads 115. It is to be noted that although the illustration is omitted in FIG. 2, the upper surface pads 113 and the lower surface pads 115 are electrically connected by via wiring provided in the substrate 111.

The substrate 111 is an insulative platy member and is a base material of the wiring substrate 110. As a material of the substrate 111, for example, glass epoxy resin, obtained such that glass cloth (glass woven fabric), which is a reinforcing material, is impregnated with thermosetting insulating resin whose main component is epoxy resin and is cured, or the like can be used. As the reinforcing material, the present invention is not limited to the glass cloth, and for example, glass non-woven fabric aramid woven fabric, aramid non-woven fabric, a liquid crystal polymer (LCP: Liquid Crystal Polymer) woven fabric, LCP non-woven fabric, or the like can be used. In addition as the thermosetting insulating resin, besides the epoxy resin, for example, polyimide resin, cyanate resin, or the like can be used.

It is to be noted that the substrate 111 is not limited to a single-layer insulating member and may be a laminated substrate having a multi-layer structure, in which an insulating layer and wiring layers are laminated. When the substrate 111 is the laminated substrate, the wiring layers which sandwich this insulating layer are electrically connected by vias passing through the insulating layer. As a material of the insulating layer, for example, insulating resin such as epoxy resin and polyimide resin or a resin material in which the epoxy resin and the polyimide resin are mixed with a filler such as silica and alumina can be used. In addition, as a material of the wiring layers, for example, copper (Cu) or a copper alloy can be used.

The solder resist layer 112 is an insulating layer which covers an upper surface of the substrate 111. Portions of the solder resist layer 112 are provided with openings, and each of the upper surface pads 113 is exposed from each of the openings. As a material of the solder resist layer 112, for example, insulating resin such as epoxy resin and acrylic resin can be used.

The upper surface pads 113 are formed on the wiring layer on the upper surface of the substrate 111 and are exposed from the openings of the solder resist layer 112 for mounting the electronic components 103. When on the upper surface of the wiring substrate 110, the electronic components 103 are mounted, a terminal 103*a* of each of the electronic components 103 is connected to each of the upper surface pads 113 by solder 103*b*. As a material of the upper surface pads 113, as with the wiring layer, for example, copper or a copper alloy can be used.

The protective insulating layer 114 is an insulating layer which covers a lower surface of the substrate 111. Portions of the protective insulating layer 114 are provided with openings, and each of the lower surface pads 115 is exposed from each of the openings. As a material of the protective insulating layer 114, for example, insulating resin such as epoxy resin and acrylic resin can be used.

The lower surface pads 115 are formed on the wiring layer on the lower surface of the substrate 111 and each of the lower surface pads 115 is exposed from each of the openings of the protective insulating layer 114 for connecting with the connection members 130 and mounting the IC chip 140 and the electronic component 150. In other words, each of the connection members 130 is joined to each of portions of the lower surface pads 115. In addition, the IC chip 140 is connected to the portions of the lower surface pads 115. Specifically, the IC chip 140 is flip-chip connected to the lower surface pads 115 by, for example, solder bumps 141. Between the wiring substrate 110 and the IC chip 140, an underfill material 142 is filled. Furthermore, terminals 150*a* of the electronic component 150 are connected to portions of the lower surface pads 115 by solder 150*b*. As a material of the lower surface pads 115, as with the wiring layer, for example, copper or a copper alloy can be used.

The lead frame 120 is a conductive member formed of, for example, metal such as copper or a copper alloy and has the leads 121 and the heat sink 122. On a lower surface of the lead frame 120, a plated layer 123 is formed and is exposed from the encapsulating resin 102 on the lower surface of the semiconductor device 100. The plated layer 123 is formed by, for example, tin (Sn) plating or solder plating.

The leads 121 are electrically connected to the IC chip 140 and the electronic components 103 and 150, which are mounted on the wiring substrate 110, via the connection members 130. A lower surface and a side surface 121*a* of each of the leads 121 are exposed from the encapsulating resin 102 and function as external terminals. At a side end portion of the lower surface of each of the leads 121 where the plated layer 123 is formed, a step is provided. The side surface 121*a* of a side of the step is exposed from the encapsulating resin 102 on each of side surfaces of the semiconductor device 100.

In a position of an upper surface of each of the leads 121, which corresponds to each of the connection members 130, a plated layer 124 formed. The plated layer 124 is formed by, for example, noble metal plating such as silver (Ag) plating. On portions of the upper surface of each of the leads 121 other than the plated layer 124, and side surfaces of each of the leads 121 opposed to the heat sink 122, an oxide film 125 is formed. In other words, on the upper surface and the side surface of each of the leads 121, which contact the encapsulating resin 102, the oxide film 125 is formed. Since the periphery of the plated layer 124 is enclosed by the oxide film 125, solder 132 of the connection members 130 does not spread to the periphery of the plated layer 124, thereby allowing positioning of the lead frame 120 and the connection members 130 to be accurately performed. It is to be noted that as the plated layer 124, besides silver plating, gold (Au) plating may be used. In addition, a plated layer obtained by laminating nickel (Ni) plating and gold plating in this order on the upper surface of each of the leads 121 or a plated layer obtained by laminating nickel plating, palladium (Pd) plating, and gold plating in this order thereon may be used.

The heat sink 122 is opposed to the IC chip 140 and the electronic component 150. The heat sink 122 dissipates, from a lower surface thereof, heat conducted from the IC chip 140 and the electronic component 150 via the encapsulating resin 102. Since the heat sink 122 is a portion of the lead frame 120 whose thermal conductivity is high and is a platy portion which has a comparatively large area and is opposed to the IC chip 140 and the electronic component 150, the heat sink 122 can efficiently dissipate heat conducted from the encapsulating resin 102. On a lower surface of the heat sink 122, the plated layer 123 is formed, and on an upper surface and side surfaces of the heat sink 122, which contact the encapsulating resin 102, the oxide film 125 is formed.

On the surfaces of each of the leads 121 and the heat sink 122, which contact the encapsulating resin 102, the oxide film 125 is formed, thereby allowing adhesiveness of the lead frame 120 and the encapsulating resin 102 to be enhanced. In other words, a hydroxide (for example, $Cu(OH)_2$) which the oxide film 125 contains is hydrogen-bonded with a hydroxyl group (—OH) which the encapsulating resin 102 cures and generates, thereby exhibiting a strong adhesive force. Therefore, on the surfaces which contact the encapsulating resin 102, the oxide film 125 is formed, thereby allowing peeling-off of the lead frame 120 and the encapsulating resin 102 to be prevented and enabling reliability of the semiconductor device 100 to be enhanced.

The connection members 130 are formed of, for example, solder balls or the like, each of which has a copper core, and connect the wiring substrate 110 and the lead frame 120. Specifically, each of the connection members 130 has a core 131 having a substantially spherical shape and solder 132 which covers an outer peripheral surface of the core 131. As the core 131, for example, a metal core formed of metal such as copper (Cu), gold (Au), and nickel (Ni), a resin core formed or resin, or the like can be used. As tare solder 132, for example, an alloy which contains lead (Pb), an alloy which contains tin (Sn) and copper (Cu), an alloy which contains tin (Sn) and antimony (Sb), an alloy which contains tin (Sn) and silver (Ag), an alloy which contains tin (Sn), silver (Ag), and copper (Cu), or the like can be used. A diameter of each of the cores 131 can be determined in consideration of a height of each of the IC chip 140 and the electronic component 150 from the lower surface of the wiring substrate 110. For example, the diameter of each of the cores 131 may be set to be equal to or greater than the height of each of the IC chip 140 and the electronic component 150 from the lower surface of the wiring substrate 110. In addition, an amount of the solder 132 can be determined in consideration of an area in which each of the lower surface pads 115 is exposed, an area of the plated layer 124, and the like.

Next, the method for manufacturing the semiconductor device 100 configured as described above will be described. Hereinafter, a method for manufacturing the wiring substrate 110 and a method for manufacturing the lead frame 120 will be described and thereafter, the method for manufacturing the semiconductor device 100 having the wiring substrate 110 and the lead frame 120 will be described.

Figure 3:
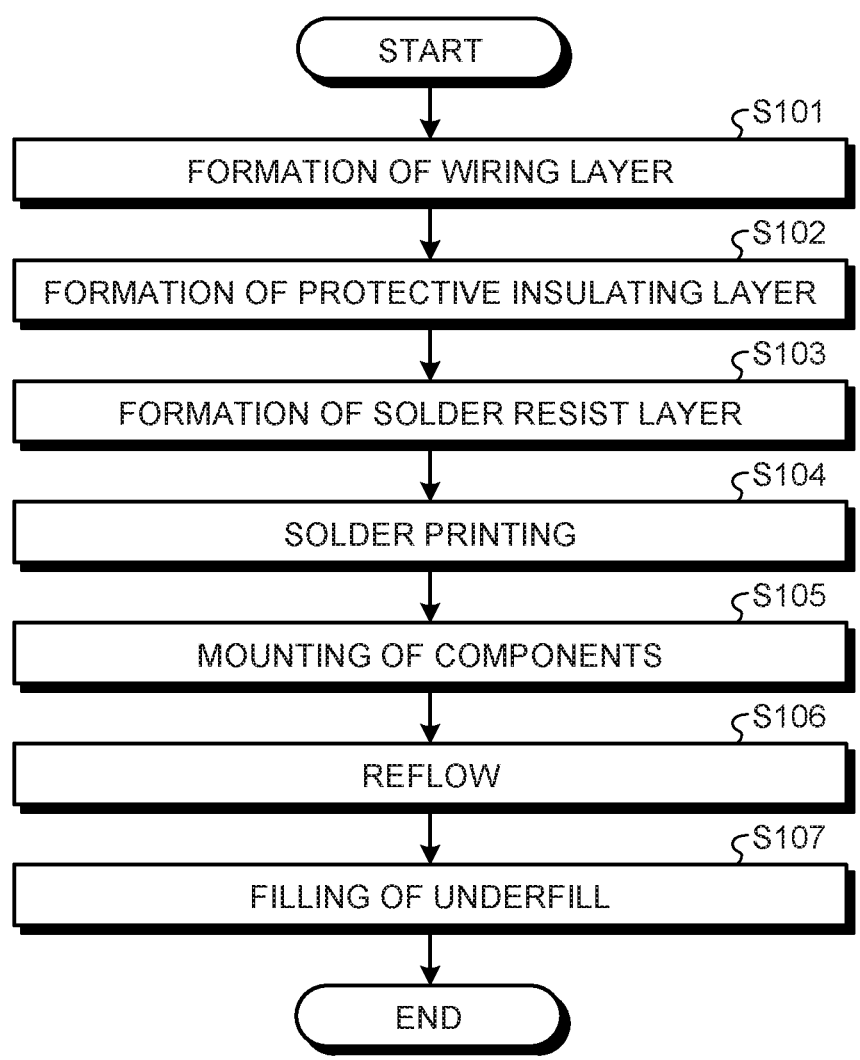
FIG. 3 is a flowchart illustrating a method for manufacturing a wiring substrate.

FIG. 3 is a flowchart illustrating the method for manufacturing the wiring substrate 110.

First, on the upper surface and the lower surface of the substrate 111, the wiring layers are formed (Step S101). Specifically, the wiring layers on the lower surface and the upper surface of the substrate 111 are sequentially formed by, for example, a semi-additive method. The wiring layer of the upper surface of the substrate 111 includes the upper surface pads 113 and the wiring layer of the lower surface of the substrate includes the lower surface pads 115. On the lower surface of the substrate 111, the protective insulating layer 114 which has the openings in positions of the lower surface pads 115 is formed (Step S102), and on the upper surface of the substrate 111, the solder resist layer 112 which has the openings in positions of the upper surface pads 113 is formed (Step S103). The solder resist layer 112 and the protective insulating layer 114 can be obtained, for example, by laminating photosensitive resin films or applying liquid or pasty resin on the upper surface and the lower surface of the substrate 111, subjecting the laminated or applied resin to exposure and development by a photolithography method, and patterning the resultant to be of desired shapes.

Figure 4:
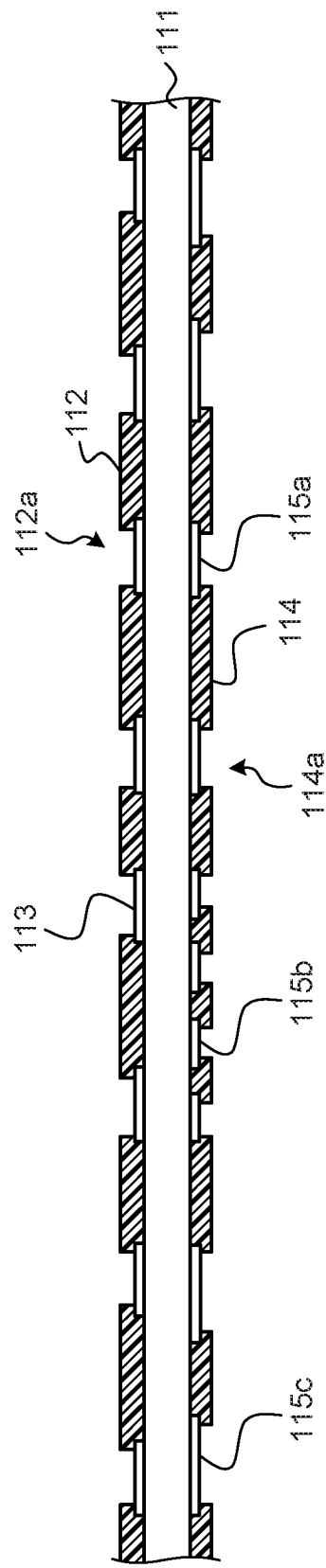
FIG. 4 is a schematic view illustrating a cross section of the wiring substrate.

By conducting the steps described up to here, for example, as illustrated FIG. 4, formed is the wiring substrate 110 in which on the upper surface of the substrate 111, the upper surface pads 113 are exposed from openings 112a of the solder resist layer 112 and on the lower surface of the substrate 111, lower surface pads 115a, 115b, and 115c are exposed from openings 114a of the protective insulating layer 114. Each of the lower surface pads 115a is a pad which connects terminals of the electronic component 150, and each of the lower surface pads 115b is a pad which flip-chip connects the IC chip 140, and each of the lower surface pads 115c is a pad which connects to each of the connection members 130. Therefore, areas in which these lower surface pads 115a, 115b, and 115c are exposed may be different from one another.

Since on the lower surface pads 115a and 115b, the IC chip 140 and the electronic component 150 are mounted, solder paste is printed (Step S104). In positions of the lower surface pads 115a, the electronic component 150 is mounted, and in positions of the lower surface pads 115b, the IC chip 140 is mounted (Step S105). The IC chip 140 and the electronic component 150 undergo a reflow process (Step S106) and thereafter, are mounted on the wiring substrate 110. In addition, as needed, between the IC chip 140 and the lower surface of the wiring substrate 110, an underfill material 142 constituted of insulating resin is filled (Step S107).

Figure 5:
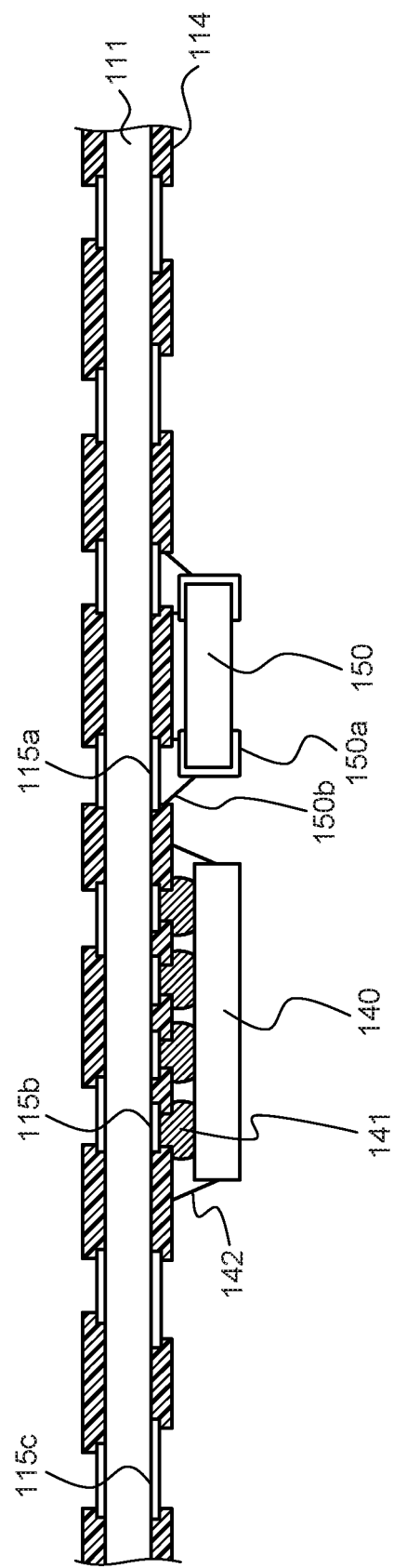
FIG. 5 is a diagram for explaining mounting of components.

By conducting the steps described up to here, for example, as illustrated in FIG. 5, on the lower surface of the wiring substrate 110, the IC chip 140 which is flip-chip connected to the lower surface pads 115b by the solder bumps 141 and the electronic component 150 whose terminals 150a are connected to the lower surface pads 115a by the solder 150b are mounted. Thus, the wiring substrate 110 which constitutes an upper layer of the semiconductor device 100 can be obtained.

Figure 6:
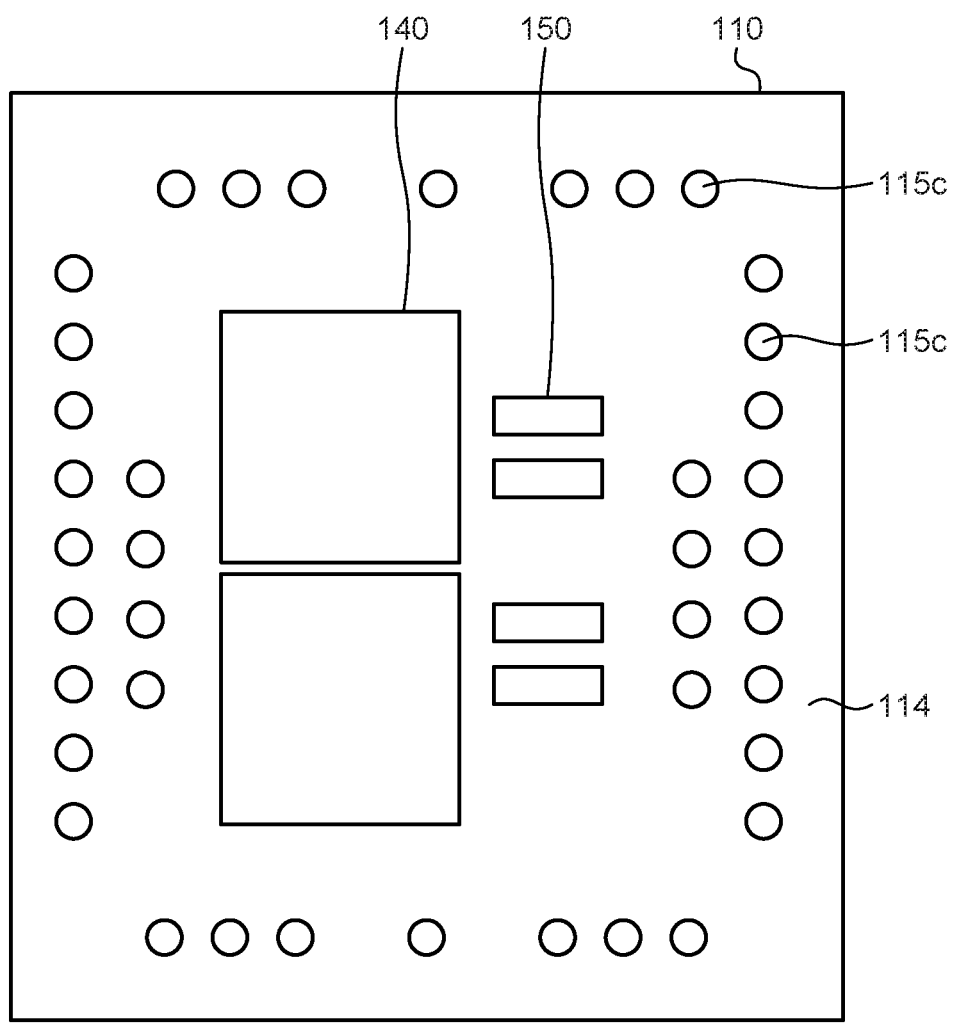
FIG. 6 is a plan view illustrating a configuration of the wiring substrate.

FIG. 6 is a plan view in which the wiring substrate 110 is viewed from a lower direction. As illustrated in FIG. 6, on the lower surface of the wiring substrate 110, the IC chip 140 and the electronic component 150 are mounted, and the lower surface pads 115c for connecting the connection members 130 are exposed from the openings of the protective insulating layer 114. It is to be noted that in order to simplify the drawing, locations of the IC 140 and the electronic component 150 in FIG. 6 do not necessarily coincide with those in FIG. 5. In addition, the locations of the IC chip 140 and the electronic component 150 are not limited to those illustrated in FIG. 6. Similarly, positions where the lower surface pads 115c are exposed are also not limited to those illustrated in FIG. 6. However, a position of the IC chip 140 corresponds to a position of the heat sink 122 of the lead frame 120 and positions the lower surface pads 115c correspond to positions of the plated layer 124 of the lead frame 120.

Figure 7:
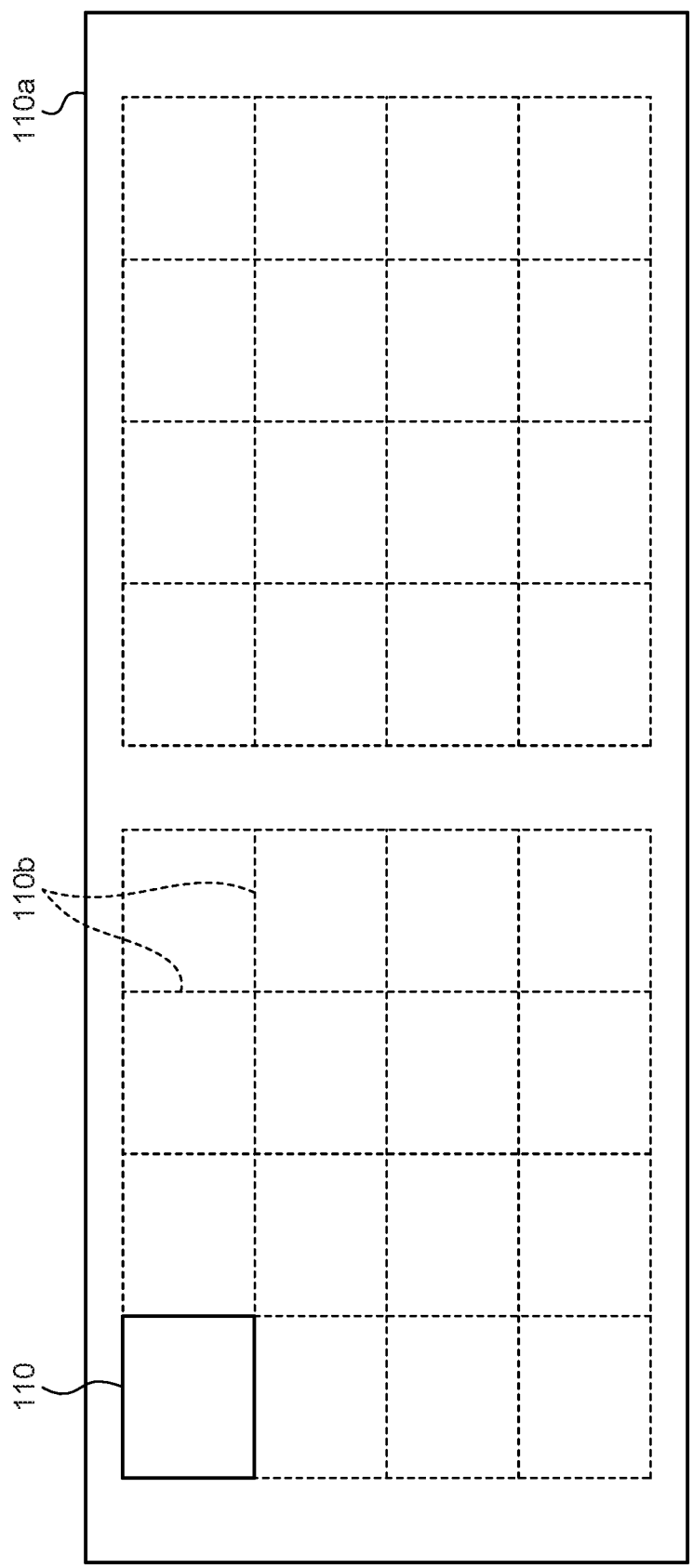
FIG. 7 is a diagram illustrating aggregate of wiring substrates.

It is preferable that a plurality of wiring substrates 110 are arrayed and concurrently manufactured, instead of being manufactured alone as a sin body. In other words, for example, as illustrated in FIG. 7, it is preferable that the plurality of wiring substrates 110 are arrayed and manufactured as aggregate 110a. In the aggregate 110a, the wiring substrates 110 are manufactured in individual sections which are divided by frame bodies 110b. It is to be noted that in FIG. 7, illustration of a detailed configuration of each of the wiring substrates 110 is omitted.

Figure 8:
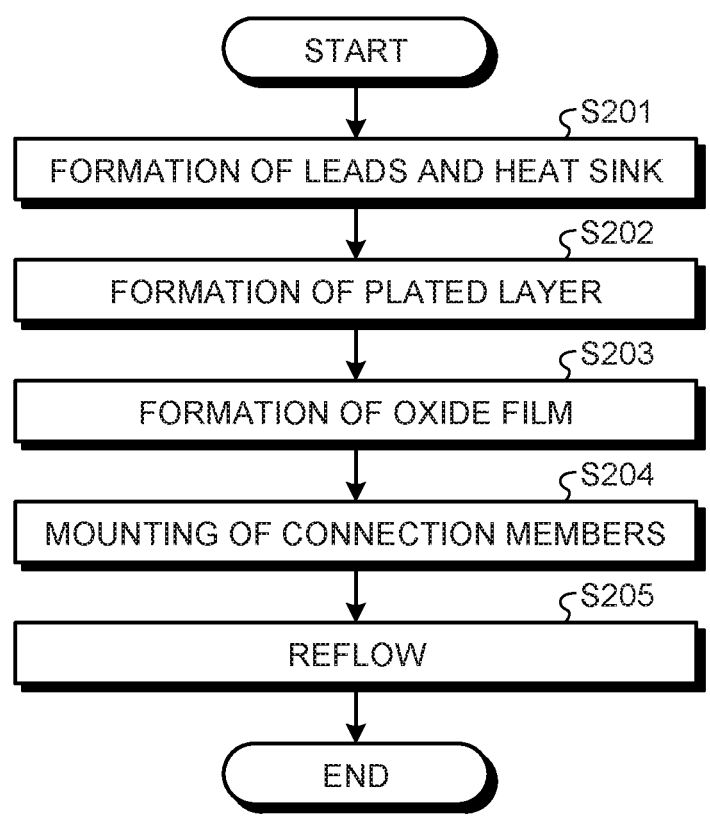
FIG. 8 is a flowchart illustrating a method for manufacturing a lead frame.

Next, FIG. 8 is a flowchart illustrating a method for manufacturing the lead frame 120.

Figure 9:
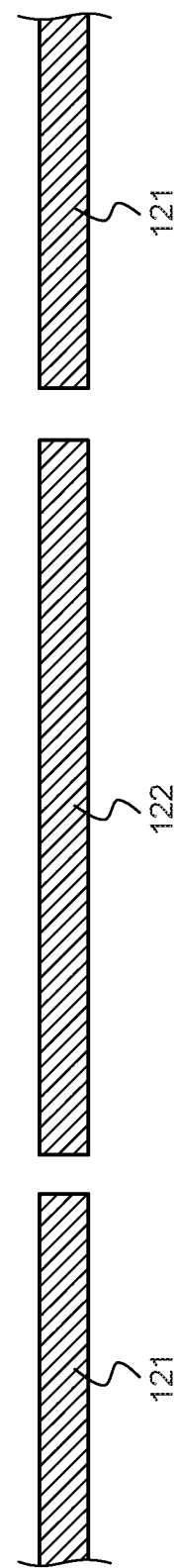
FIG. 9 is a diagram for explaining a step or forming leads and a heat sink.

For manufacturing the lead frame 120, for example, a metal plate of copper or a copper alloy, whose thickness is approximately 50 μm to 200 μm can be used. The metal plate is subjected to etching or press working, thereby forming the leads 121 and the heat sink 122 (Step S201). In other words, for example, as illustrated in FIG. 9, the leads 121 and the heat sink 122 are formed of the metal plate. When the lead frame 120 is joined to the wiring substrate 110, the leads 121 are provided in positions opposed to the lower surface pads 115c, and each of the leads 121 has, for example, an elongate rectangular shape in a top view. The lead frame 120 has the plurality of leads 121 and thicknesses of these leads 121 are even. In addition, when the lead frame 120 is joined to the wiring substrate 110, the heat sink 122 is provided in a position opposed to the IC chip 140 and has a rectangular shape in a top view, having a comparatively large area.

Figure 10:
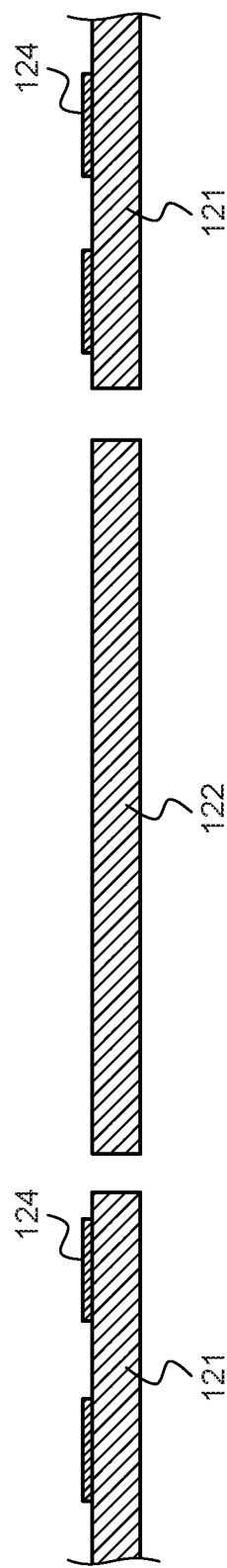
FIG. 10 is a diagram for explaining a step of forming a plated layer.

The plated layer 124 is formed on the leads 121 (Step S202). In other words, for example, as illustrated in FIG. 10, on upper surfaces of the leads 121, the plated layer 124 is formed by, for example, silver plating. When the lead frame 120 is joined to the wiring substrate 110, the plated layer 124 is formed in positions opposed to the lower surface pads 115c. In other words, when the lead frame 120 is joined to the wiring substrate 110, the lower surface pads 115c and the plated layer 124 which are opposed to each other are connected by the connection members 130. As described above, the thicknesses of a plurality of leads 121 are even and in particular, thicknesses of portions of the leads 121, where the plated layer 124 formed, are even. In addition, it is preferable that a magnitude of a width (or a diameter) of the plated layer 124 is made smaller than a width of each of the leads 121 in a short side direction when the leads 121 are viewed in a top view. In other words, it is preferable that the plated layer 124 does not bulge out from upper surfaces of the leads 121.

For formation of the plated layer 124, for example, a photosensitive dry film is laminated on an upper surface of the lead frame 120 by thermocompression bonding, and the dry film is subjected to patterning by the photolithography method and a resist layer is thereby formed. The plated layer 124 formed of noble metal such as silver (Ag) is formed by an electroplating method or an electrolessplating method, with the resist layer used as a plating mask. After the plated layer 124 has been formed, the resist layer is removed by, for example, alkaline peeling liquid.

Figure 11:
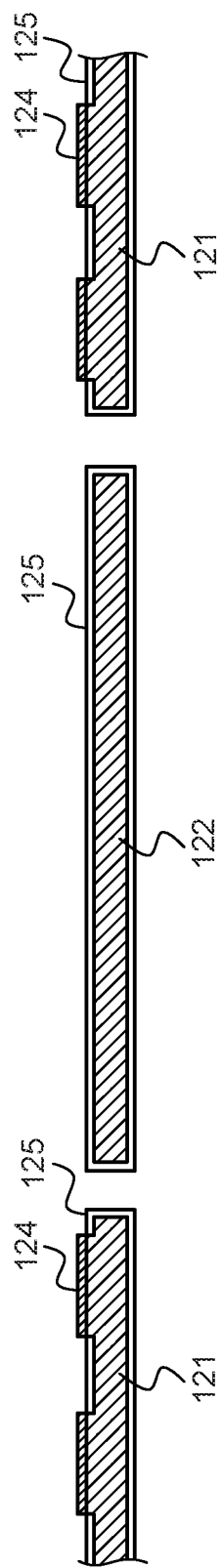
FIG. 11 is a diagram for explaining a step of forming an oxide film.

When the plated layer 124 has been formed, the oxide film 125 is formed by anodizing the lead frame 120 (Step S203). In other words, the lead frame 120 is anodized, for example, as illustrated in FIG. 11, on surfaces of the leads 121 and the heat sink 122, the oxide film 125 is formed. At this time, since the plated layer 124 is a plated layer formed of, for example, the noble metal such as silver (Ag), the plated layer 124 is not anodized. Accordingly, the oxide film 125 is formed on surfaces of the leads 121 and a surface of the heat sink 122 except portions on which the plated layer 124 is formed.

Anodizing of the lead frame 120 is performed, for example, as follows. Specifically, the lead frame 120 is immersed as an anode in anodizing treatment liquid which is an electrolyte, and energization with an electrode formed of platinum (Pt) or the like, which is opposed to the lead frame 120, as a cathode is conducted (for example, application of a pulse voltage). When the lead frame 120 is formed of copper or a copper alloy, composition of the anodizing treatment liquid and treatment conditions can be set as follows.

Anodizing treatment liquid:
Sodium chlorite ($NaClO_2$) 0 g/L to 100 g/L
Sodium hydroxide (NaOH) 5 g/L to 60 g/L
Trisodium phosphate ($Na_3PO_4$) 0 g/L to 200 g/L
Treatment conditions:
Bath temperature Approximately 50 degrees to 80 degrees
Treatment time A period of approximately 1 second to 20 seconds
Current density Approximately 0.2 $A/dm^2$ to 10 $A/dm^2$ By anodizing the lead frame 120 under the above-mentioned conditions, the oxide film 125 having a thickness of, for example, 0.1 μm to 0.2 μm is formed. The thickness of the oxide film 125 can be adjusted by changing the composition of the anodizing treatment liquid and the treatment conditions such as a voltage and the treatment time. The oxide film 125 is a copper oxide film including a hydroxide and has needle crystals. As the hydroxide, a cupric hydroxide ($Cu(OH)_2$) is included. In addition, each of the needle crystals has a grain size of, for example, approximately 0.5 μm or less.

When the oxide film 125 has been formed on the lead frame 120, the connection members 130 are mounted in positions of the plated layer 124 (Step S204). The reflow process is conducted (Step S205), and the connection members 130 are joined to the plated layer 124 by the solder 132 around the cores 131. At this time, since the oxide film 125 is formed around the plated layer 124, the solder 132 does not spread to the periphery of the plated layer 124 and positioning of the connection members 130 can be made accurate. It is preferable that a magnitude or a width (or a diameter) of each of the connection members 130 is made smaller than a width of each of the leads 121 in a short side direction, as in a top view. In other words, it is preferable that the connection members 130 do not bulge out from the upper surfaces of the leads 121. Thus, the connection members 130 which are joined to the upper surfaces of the neighboring leads 121 do not contact each other, thereby allowing a short circuit to be prevented.

Here, the reason why the solder 132 does not spread to the periphery of the plated layer 124 is as described below. Specifically, when the connection members 130 are mounted, in order to ensure wettability of the solder 132, flux is applied to the plated layer 124. Since the flux has a function to reduce and remove a natural oxide film on a surface of the metal layer, when the flux flows out to the oxide film 125 around the plated layer 124, the oxide film 125 is reduced and an active force of the flux is lowered. As a result of this, around the plated layer 124, the wettability of the solder 132 cannot be obtained and wet-spreading of the solder 132 is suppressed. As described above, since the oxide film 125 reduces the active force of the flux, the solder 132 does not spread to the periphery of the plated layer 124, thereby allowing positioning of the connection members 130 to be made accurate.

It is to be noted that when the thickness of the oxide film 125 is too thin, the active force of the flux is not excessively reduced. On the other hand, when the thickness of the oxide film 125 is too thick, peeling-off inside the oxide film 125 is likely to be caused. Therefore, by appropriately setting the conditions of the anodizing as described above, the thickness of the oxide film 125 is adjusted to be, for example, 0.1 μm to 0.2 μm.

Figure 12:
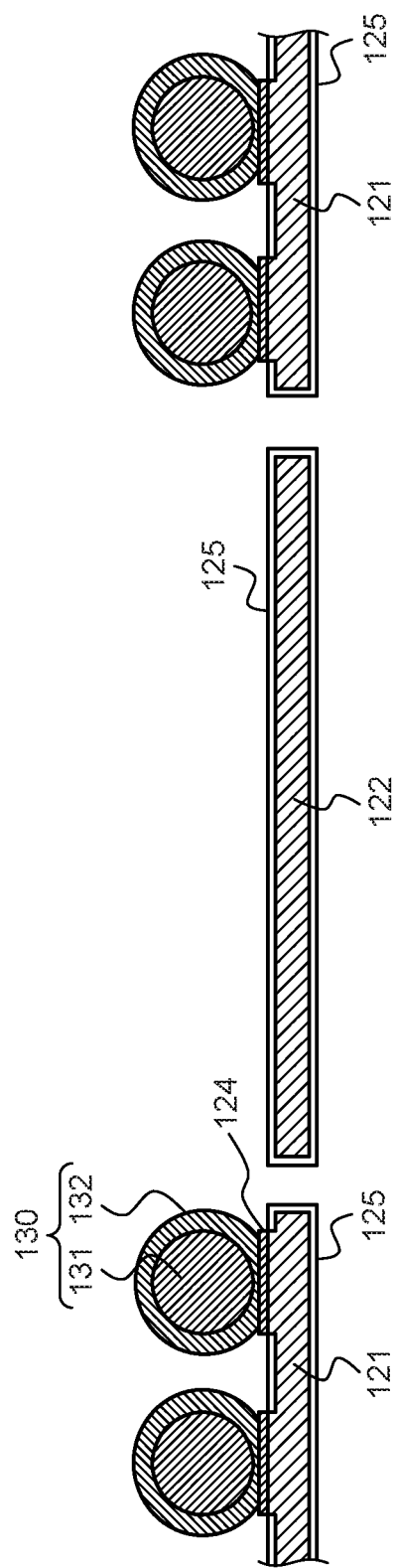
FIG. 12 is a diagram for explaining a step of mounting connection members.

By conducting the steps described up to here, for example, as illustrated in FIG. 12, the connection members 130 are joined to the plated layer 124 of the leads 121 and, on the surfaces of the leads 121 except the plated layer 124, the oxide film 125 is formed. In addition, also on the surface of the heat sink 122, the oxide film 125 is formed. Thus, the lead frame 120 which constitutes a lower layer of the semiconductor device 100 can be obtained.

Figure 13:
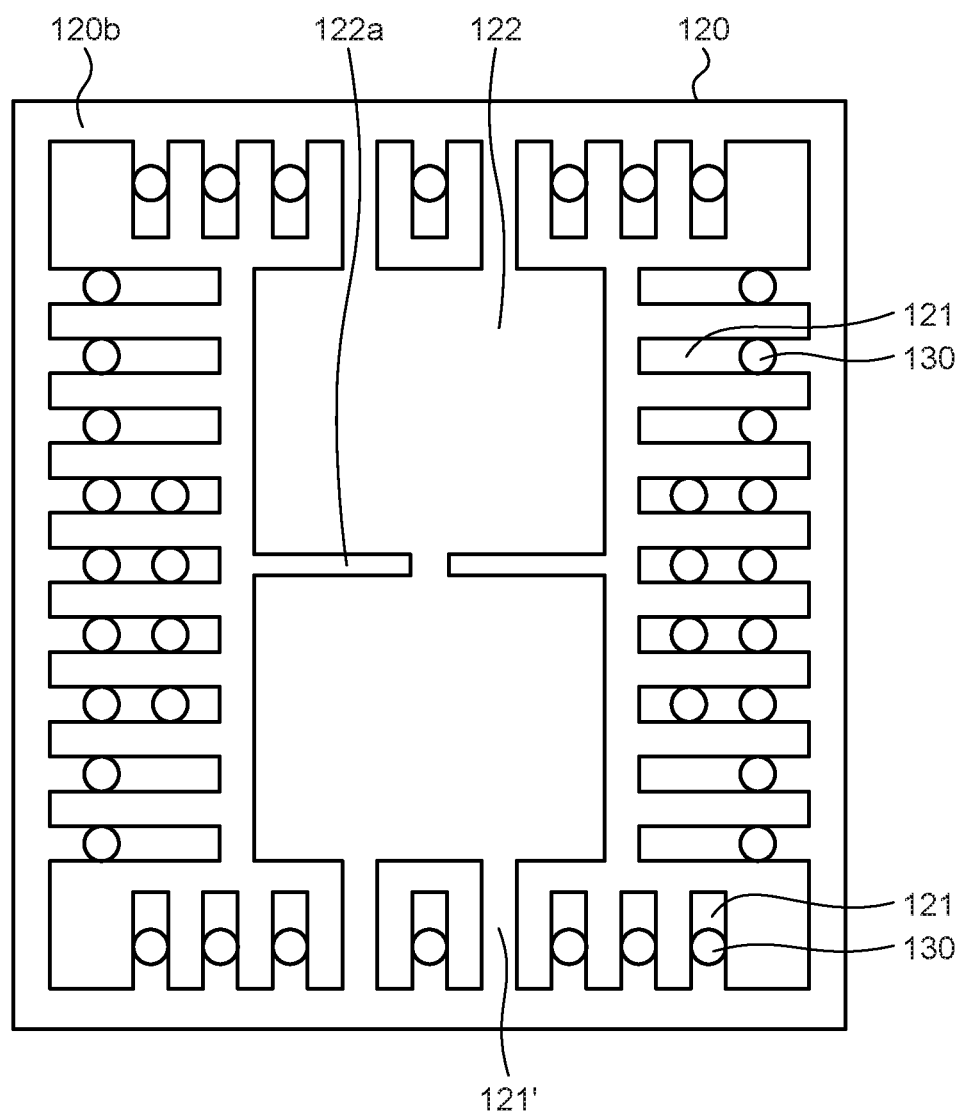
FIG. 13 is a plan view illustrating a configuration the lead frame.

FIG. 13 is a plan view in which the lead frame 120 is viewed from an upper direction. As illustrated in FIG. 13, the lead frame 120 has the plurality of leads 121, each of which is of the elongate rectangular shape, and the heat sink 122 which has the comparatively large area and is of the rectangular shape. The heat sink 122 is connected and supported to a frame body 120b therearound by supporting leads 121'. One or two connection members 130 are joined to each of the leads 121. The number of the connection members 130 joined to each of the leads 121 is determined, for example, in consideration of a magnitude of current flowing between each of the leads and the wiring layer of the wiring substrate 110. In other words, as to each of leads 121, for example, through which comparatively large current flows, the number of the connect on members 130 may be increased, and electrical resistance be each of the leads 121 and the wiring layer of the wiring substrate 110 may be reduced.

The heat sink 122 is divided by slits 122a into two. The slits 122a are provided, thereby allowing adhesiveness between the lead frame 120 and the encapsulating resin 102 filled between the wiring substrate 110 and the lead frame 120 to be enhanced. In addition, for example, when two IC chips 140 are arranged and mounted the wiring substrate 110, the heat sink 122 is provided in a position where is opposed to each of the IC chips 140, and dissipation can be independently performed.

It is to be noted that arrangement of the leads 121 and the heat sink 122 is not limited to that illustrated in FIG. 13. It is to be noted that positions of the plated layer 124 of the leads 121 and connection members 130 correspond to positions of the lower surface pads 115c of the wiring substrate 110 and a position of the heat sink 122 corresponds to a position of the IC chip 140 mounted on the wiring substrate 110. In addition, positions of the slits 122a are not limited to those illustrated in FIG. 13, and for example, a portion in the vicinity of a central portion of the heat sink 122 may be perforated and a slit may be thereby formed.

Figure 14:
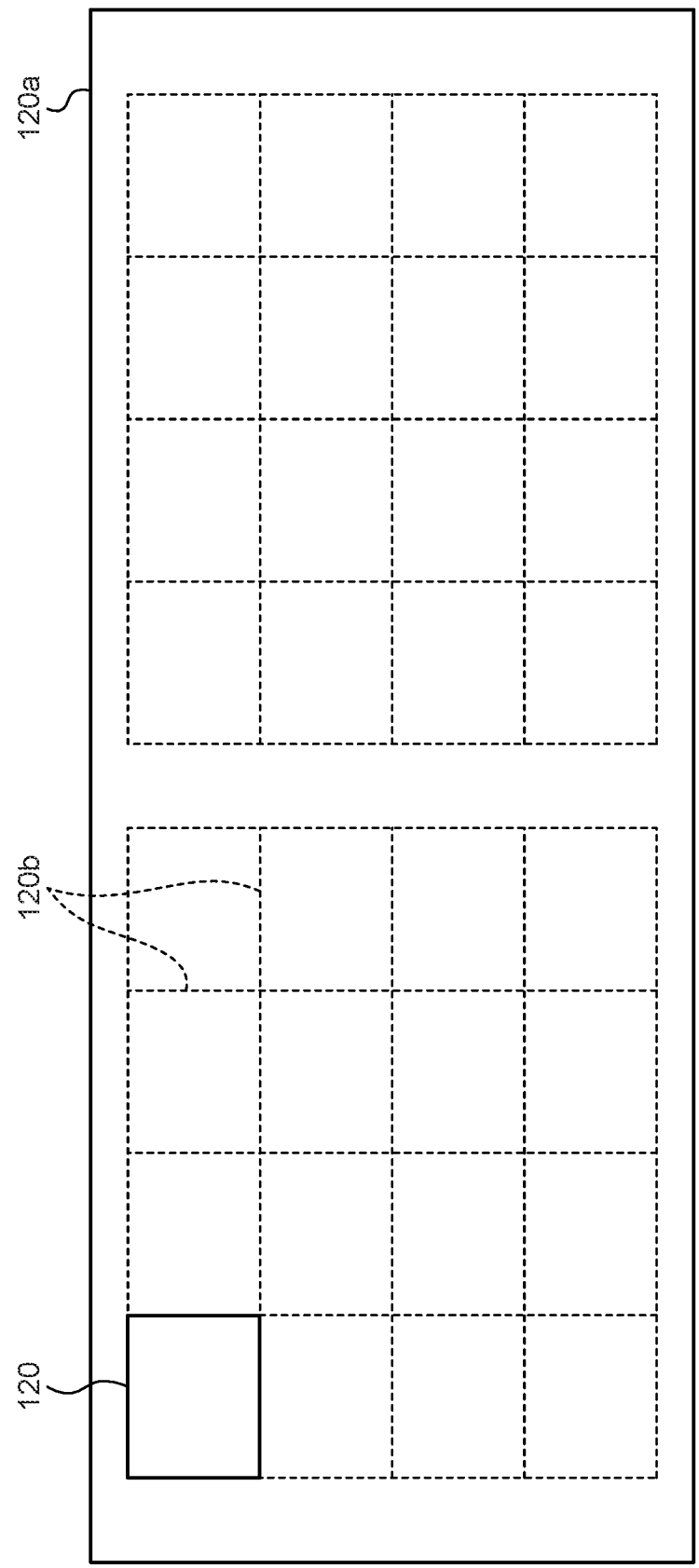
FIG. 14 is a diagram illustrating aggregate of lead frames.

It is preferable that a plurality of lead frames 120 are arrayed and concurrently manufactured, instead of being manufactured alone as a single body. In other words, for example, as illustrated in FIG. 14, it is preferable that the plurality of lead frame 120 are arrayed and manufactured as aggregate 120a. In the aggregate 120a, the lead frames 120 are manufactured in individual sections which are divided by frame bodies 120b. It is to be noted that in FIG. 14, illustration of a detailed configuration of each of the lead frames 120 is omitted.

Figure 15:
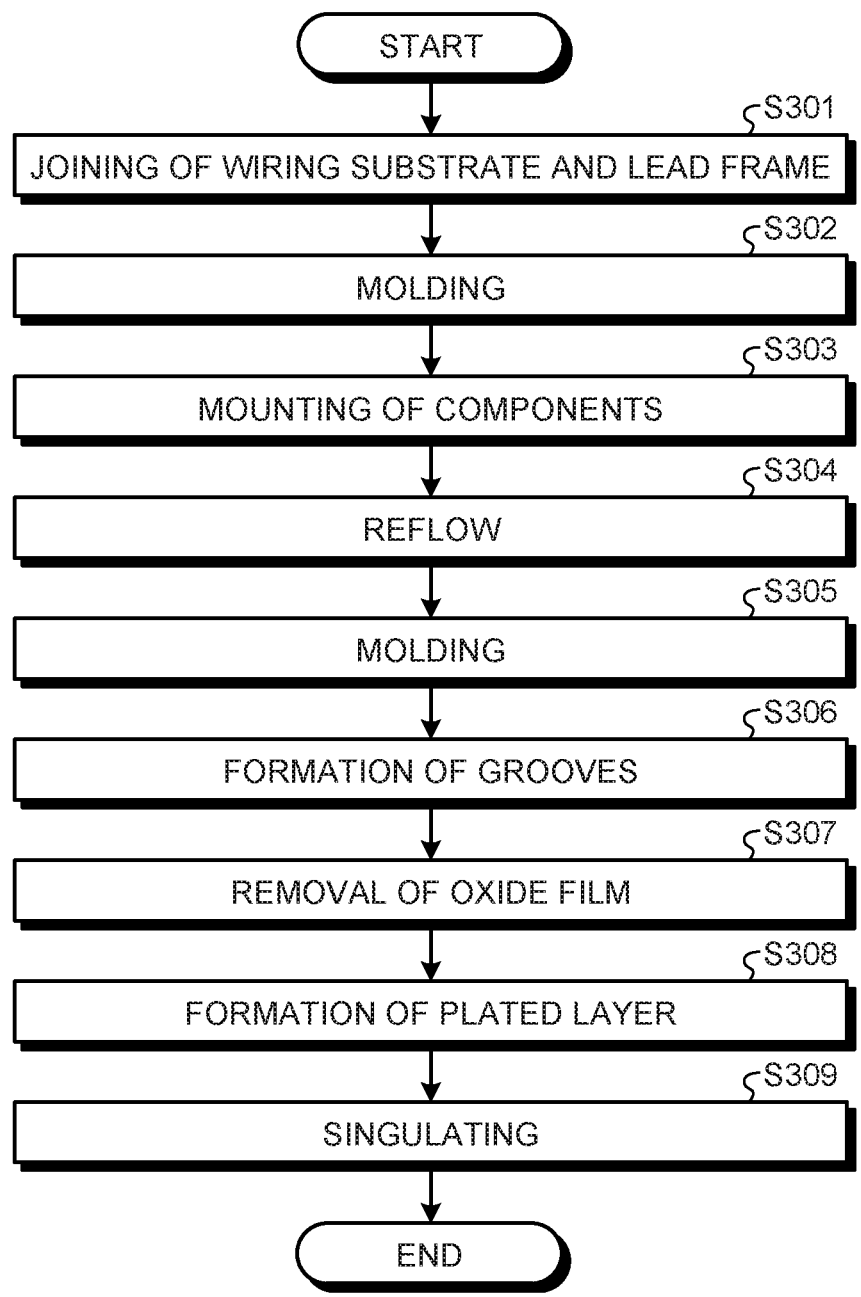
FIG. 15 is a flowchart illustrating a method for manufacturing a semiconductor device.

Next, FIG. 15 is a flowchart illustrating a method for manufacturing the semiconductor device 100. The semiconductor device 100 is manufactured by using the above-described wiring substrate 110 and lead frame 120.

Figure 16:
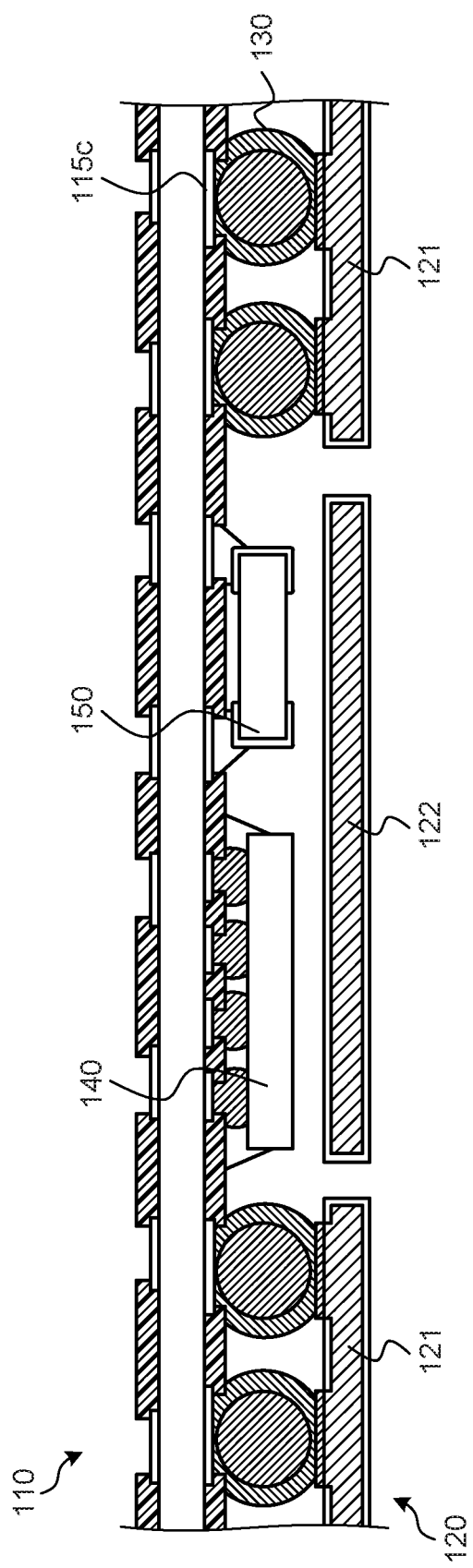
FIG. 16 is a diagram for explaining a joining step.

The wiring substrate 110 and the lead frame 120 are joined by employing, for example, a thermal compression bonding (TCB) method (Step S301). Specifically, the connection members 130 joined to the leads 121 of the lead frame 120 are joined to the lower surface pads 115c of the wiring substrate 110 by heat and pressure. At this time, since the thicknesses of portions of the plurality of leads 121, in particular, where the connection members 130 are provided, are even, all of the connection members 130 and the lower surface pads 115c are evenly pressurized, thereby allowing connection failure of the connection members 130 and the lower surface pads 115c to be prevented. Thus, for example, as illustrated in FIG. 16, the wiring substrate 110 and the lead frame 120 are integrated. Between the wiring substrate 110 and the lead frame 120, the IC chip 140 and the electronic component 150 are disposed, and the IC chip 140 and the electronic component 150 are opposed to the heat sink 122 of the lead frame 120. A lower surface of the IC chip 140 and an upper surface of the heat sink 122 are separated from each other by, for example, approximately 40 μm to 50 μm. This interval can be adjusted in accordance with a diameter of each of the cores 131 of the connection members 130.

Figure 17:
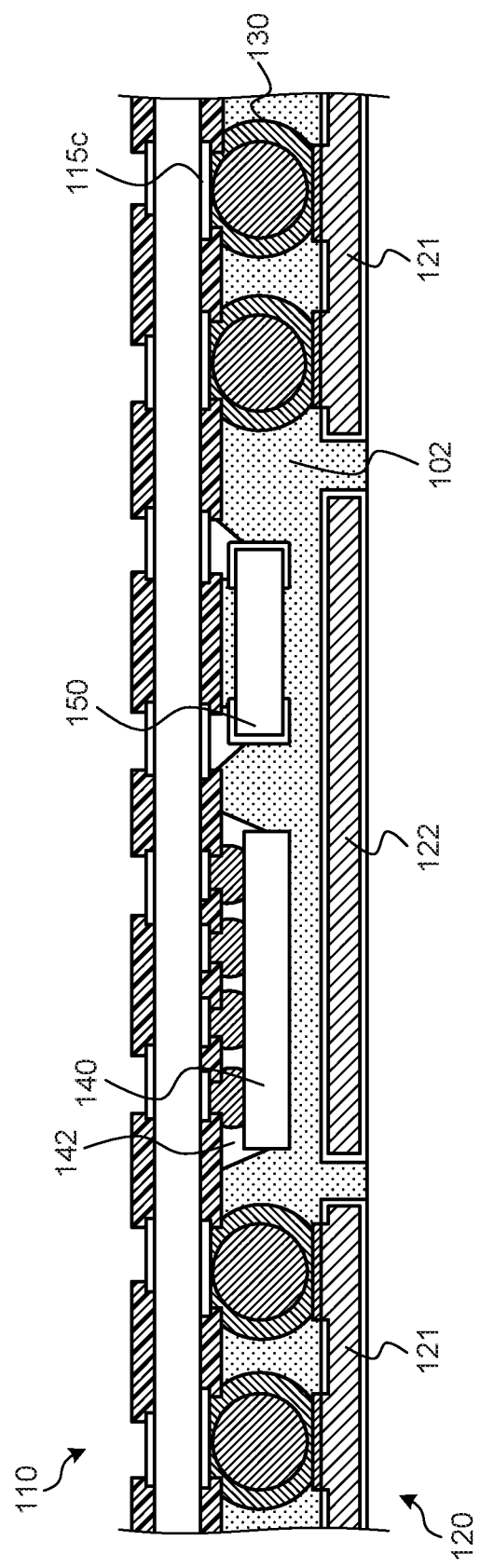
FIG. 17 is a diagram for explaining a molding step.

For example, transfer molding is conducted (Step S302), whereby the encapsulating resin 102 is filled in a space between the wiring substrate 110 and the lead frame 120. In the transfer molding, the joined wiring substrate 110 and lead frame 120 are housed in a mold, and fluidized encapsulating resin 102 is injected into the mold. The encapsulating resin 102 is heated at a predetermined temperature (for example, 175 degrees) and cured. Thus, for example, as illustrated in FIG. 17, the encapsulating resin 102 is filled in the space between the wiring substrate 110 and the lead frame 120, and the connection members 130, the IC chip 140, and the electronic component 150 are encapsulated. Even when the IC chip 140 and the electronic component 150 are encapsulated, heat generated by these components is conducted via the encapsulating resin 102 to the heat sink 122. As a result, dissipation efficiency of the semiconductor device 100 can be enhanced.

Figure 18:
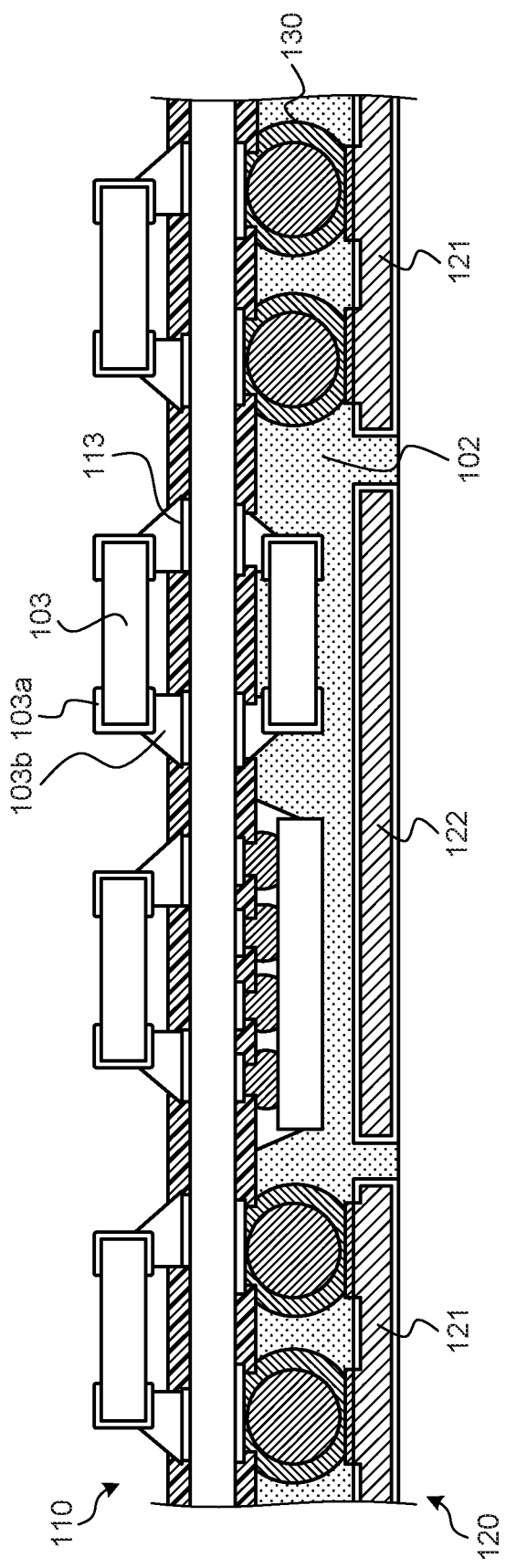
FIG. 18 is a diagram for explaining mounting of components.

After the IC chip 140 and the electronic component 150 have been encapsulated, the electronic components 103 are mounted on the upper surface of the wiring substrate 110 (Step S303). The electronic components 103 undergo a reflow process (Step S304) and thereafter, are mounted on the wiring substrate 110. In other words, for example, as illustrated in FIG. 18, the terminal 103a of each of the electronic components 103 is connected to each of the upper surface pads 113 by the solder 103b and the electronic components 103 are mounted on the upper surface of the wiring substrate 110. As the electronic components 103, for example, passive components such as capacitors, inductors, and resistance elements can be used. In addition, the electronic components 103 may be, for example, active components such as IC chips.

Figure 19:
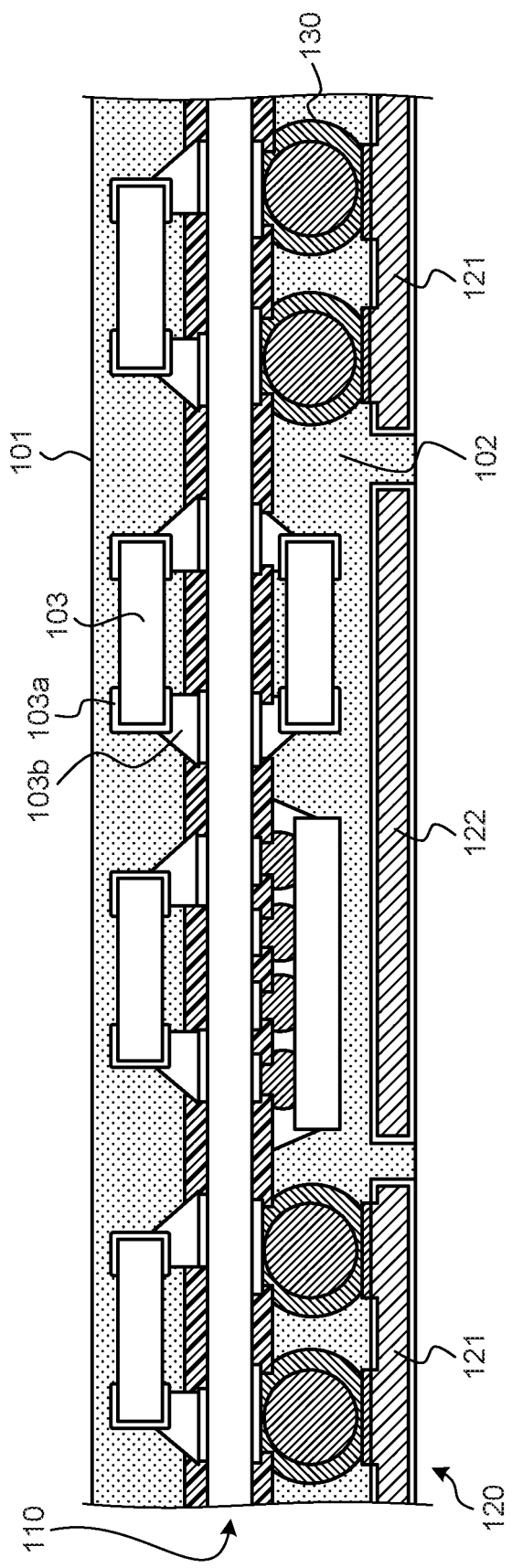
FIG. 19 is a diagram for explaining a molding step.

For example, the transfer molding is conducted (Step S305), whereby the electronic components 103 on the upper surface of the wiring substrate 110 are encapsulated by the encapsulating resin 101. As the encapsulating resin 101, for example, the insulating resin such as the thermosetting epoxy resin, which contains the filler, can be used. In the transfer molding, a structure which is constituted of the wiring substrate 110 having the electronic components 103 mounted thereon and the lead frame 120 is housed in the mold, and the fluidized encapsulating resin 101 is injected into the mold. The encapsulating resin 101 is heated at a predetermined temperature (for example, 175 degrees) and cured. Thus, for example, as illustrated in FIG. 19, the upper surface of the wiring substrate 110 and the electronic components 103 are covered by the encapsulating resin 101 and the electronic components 103 are encapsulated.

Figure 20:
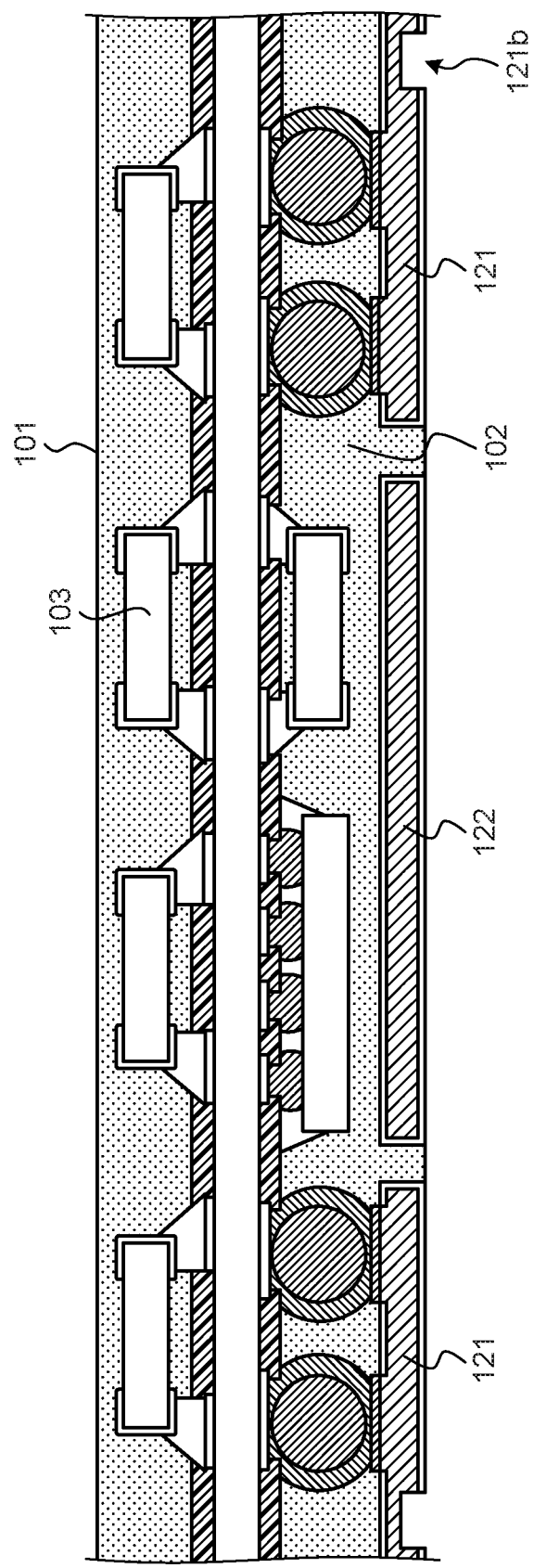
FIG. 20 is a diagram for explaining a step of forming grooves.

Subsequently, on the lower surface of the lead frame 120, grooves are formed (Step S306). Specifically, for example, as illustrated in FIG. 20, only one end portion of a lower surface of each of the leads 121 in a thickness direction is cut (half-cut), thereby forming each groove 121b. At this time, since the encapsulating resin 102 between the leads 121 is concurrently cut, a groove integrated with each groove 121b is formed also in the encapsulating resin 102. Since a depth of each of the grooves 121b is larger than the thickness of the oxide film 125, in the process of forming the grooves 121b, the oxide film 125 in positions of the grooves 121b is removed. Accordingly, in the grooves 121b, base material of the lead frame 120 is exposed. The grooves 121b are formed in positions constituting side surfaces of the semiconductor device 100. In other words, the structure illustrated in FIG. 20 is cut in an upward and downward direction in positions passing along the grooves 121b, thereby obtaining the semiconductor device 100.

Figure 21:
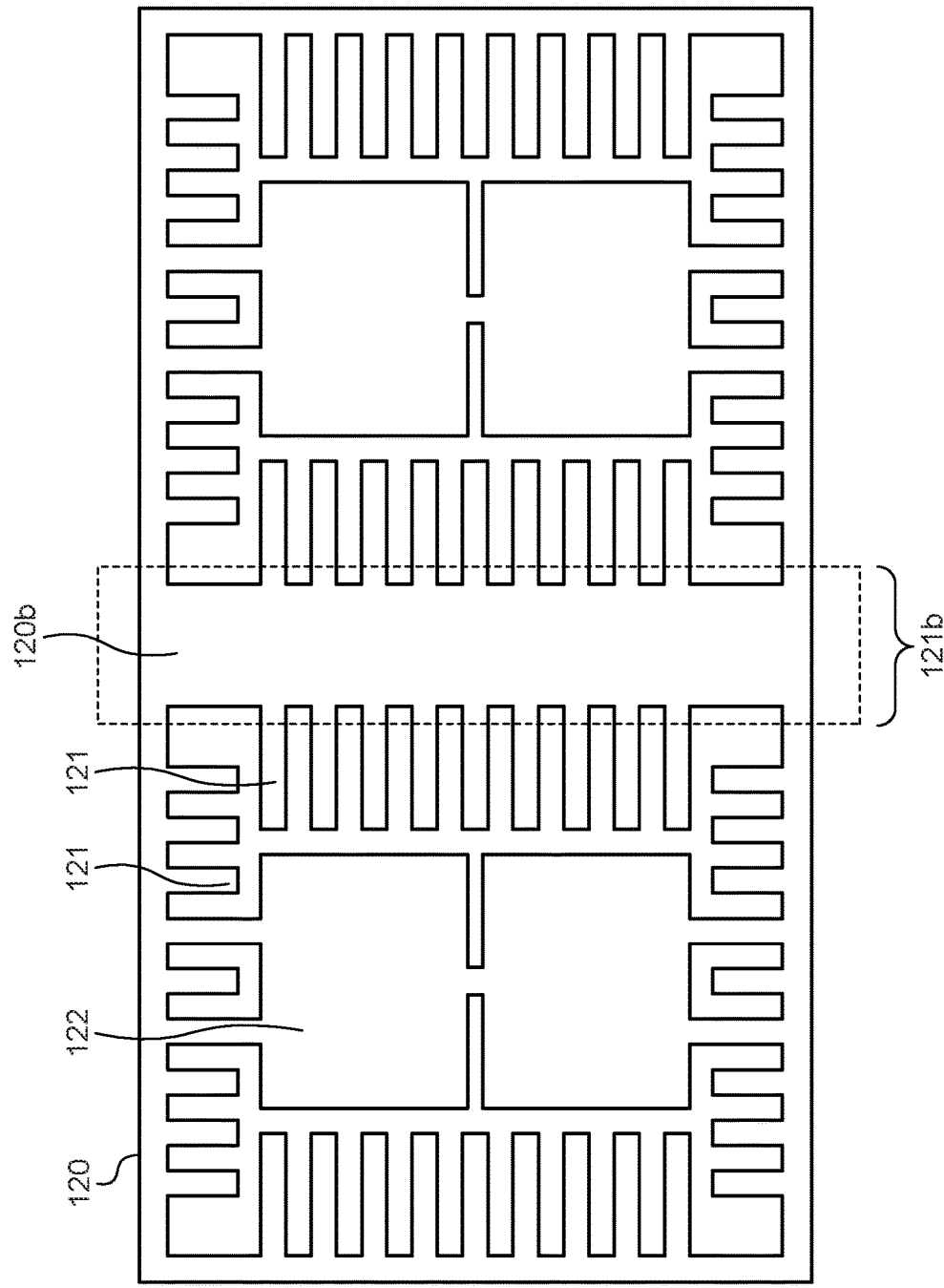
FIG. 21 is a diagram illustrating one example of a position where a groove is formed.

Here, the wiring substrates 110 and the lead frames 120 are formed as the aggregate 110a and the aggregate 120a, respectively and joining of each wiring substrate 110 and each lead frame 120 and the process such as the transfer molding by the encapsulating resin 101 and the encapsulating resin 102 are also conducted while the aggregate 110a and the aggregate 120a remain as they are. Therefore, the grooves 121b may be formed over mutually neighboring lead frames 120 in the aggregate 120a. Specifically, for example, as illustrated in FIG. 21, a range of end portions of two neighboring lead frames 120 and frame bodies 120b is cut (half-cut), whereby each groove 121b may be formed. In end portions of the leads 121 which are exposed on the side surfaces of the semiconductor device 100 by forming, the grooves 121b, steps are formed. It is to be noted that although in FIG. 21, only the groove 121b formed between the illustrated two lead frames 120 is s rated, each groove 121b is formed between all of the neighboring lead frames 120. Accordingly, the grooves 121b are formed on four sides of each of the lead frames 120.

After the grooves 121b have been formed, the oxide film 125 on the lower surface of each of the lead frames 120 is removed (Step S307). In addition, together with the removal of the oxide film 125, a residue of the encapsulating resin 102, which is brought about on the lower surfaces of the leads 121 and the heat sink 122, is removed. The removal of the oxide film 125 and the residue of the encapsulating resin 102 is conducted by, for example, acid treatment, alkali treatment, or wet blasting treatment. The oxide film 125 is removed, whereby the base material of the lead frame 120 is exposed on the lower surfaces of the leads 121 and the heat sink 122. On the other hand, the oxide film 125, which contacts the encapsulating resin 102, on the side surfaces and the upper surfaces of the leads 121 and the heat sink 122 remains.

On the lower surfaces of the leads 121 and the heat sink 122, the plated layer 123 is formed (Step S308). In other words, on the lower surface of the lead frame 120, the plated layer 123 formed of, for example, tin (Sn) or solder is formed by employing the electroplating method or the electrolessplating method. At this time, also inside the grooves 121b, the plated layer 123 is formed.

Figure 22:
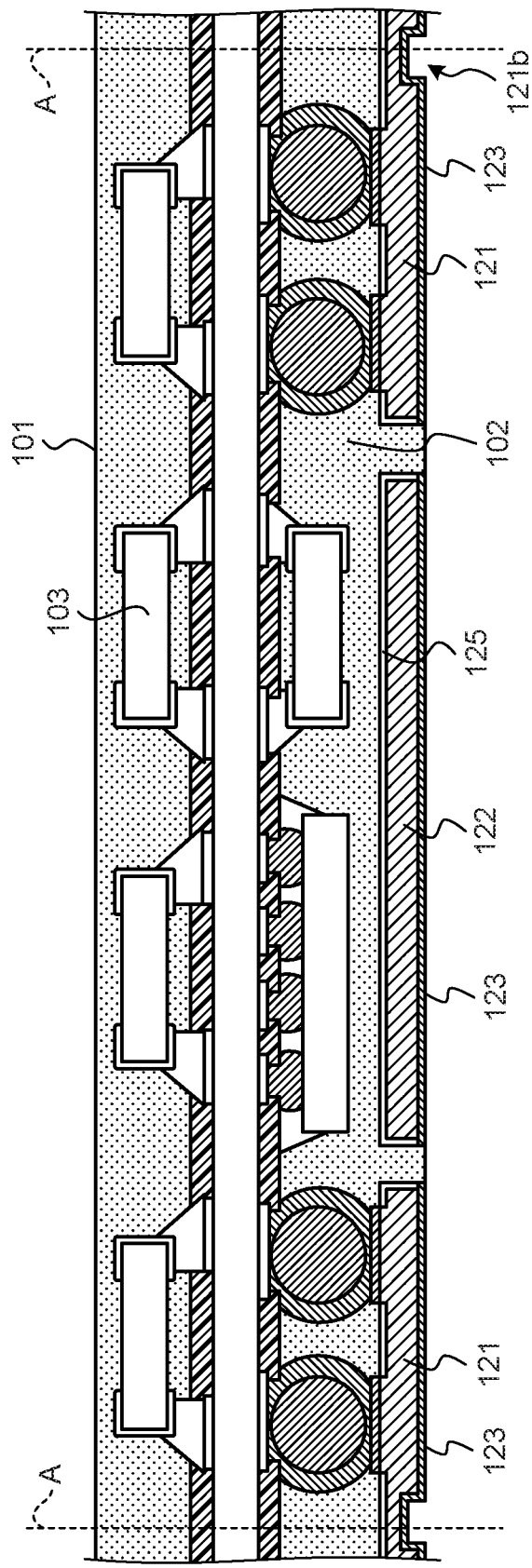
FIG. 22 is a diagram for explaining a singulating step.

By conducting the steps described up to here, for example, as illustrated in FIG. 22, a structure having a structure similar to the semiconductor device 100 is obtained. Since this structure is constituted of the aggregate 110a which includes the plurality of wiring substrates 110 and the aggregate 120a which includes the plurality of lead frame 120, singulating in which the individual wiring substrates 110 and lead frames 120 are cut out is conducted (Step S309). Specifically, the structure illustrated in FIG. 22 is cut along cutting lines A, each of which passes along each of the grooves 121b, for example, by a dicer or a slicer, thereby obtaining the semiconductor devices 100. Since each of the cutting lines A passes along each of the grooves 121b, end portions of the leads 121 which are exposed on side surfaces of each of the semiconductor devices 100 are portions which are thin, as compared with the other portions.

Figure 23:
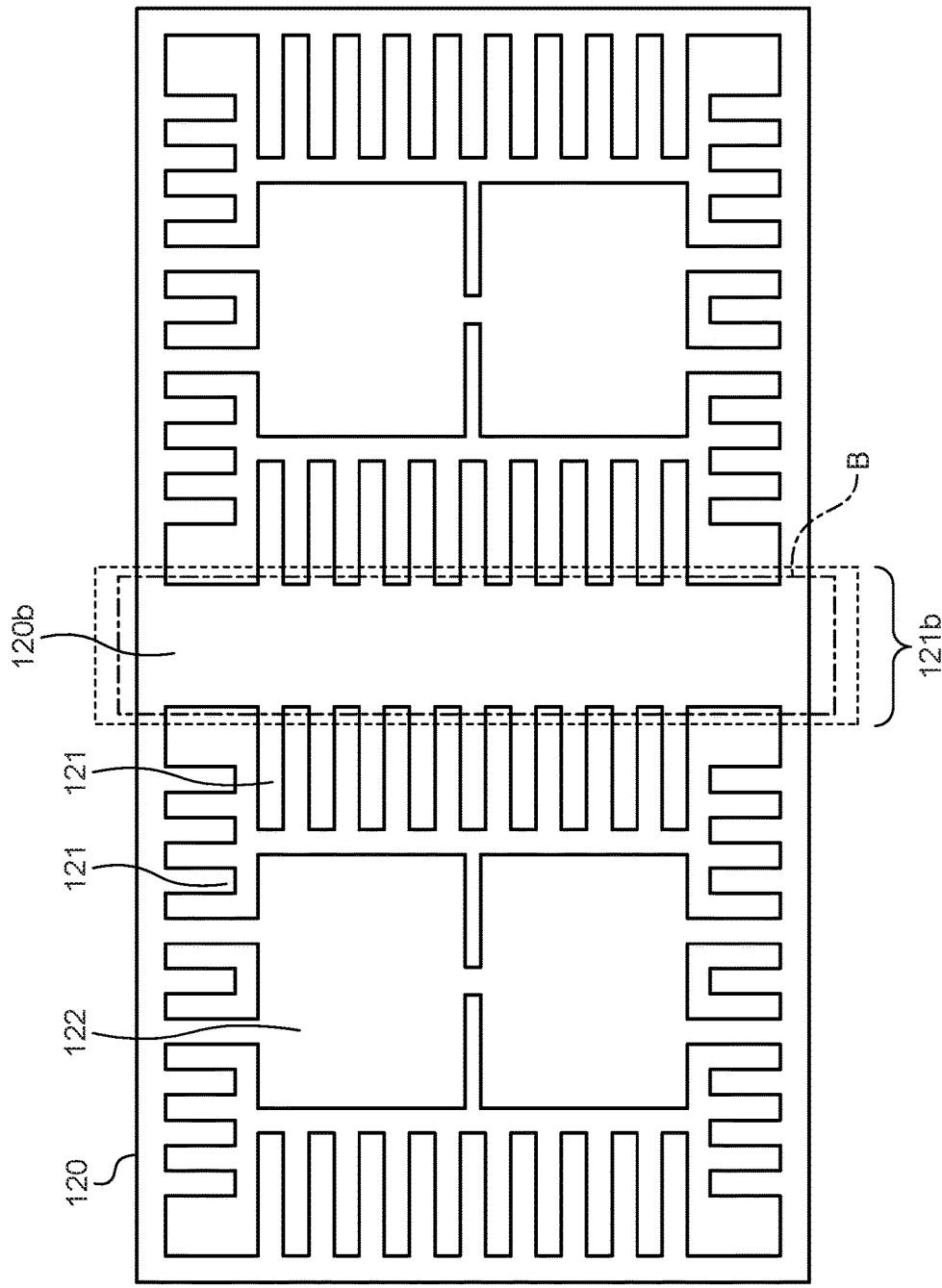
FIG. 23 is a diagram illustrating one example of a cutting position.

It is to be noted that when each of the grooves 121b is formed over the mutually neighboring lead frames 120, for example, as illustrated in FIG. 23, dicing processing is conducted by a dicing blade which can cut a range B including each of the frame bodies 120b, thereby lowing the neighboring semiconductor devices 100 to be separated by cutting performed once. Also in this case, since the range B is included inside each of the grooves 121b, end portions of the leads 121 which are exposed on the side surfaces of each of the semiconductor devices 100 are portions which are thin, as compared with the other portions. Although in FIG. 23, only the cutting range B between the illustrated two lead frames 120 is illustrated, cutting ranges, each of which is the above-mentioned cutting range, are set between all of the neighboring lead frames 120. Accordingly, four sides of each of the lead frames 120 are separated from the neighboring lead frames 120 in cutting ranges, each of which is similar to the cutting range B.

Figure 24:
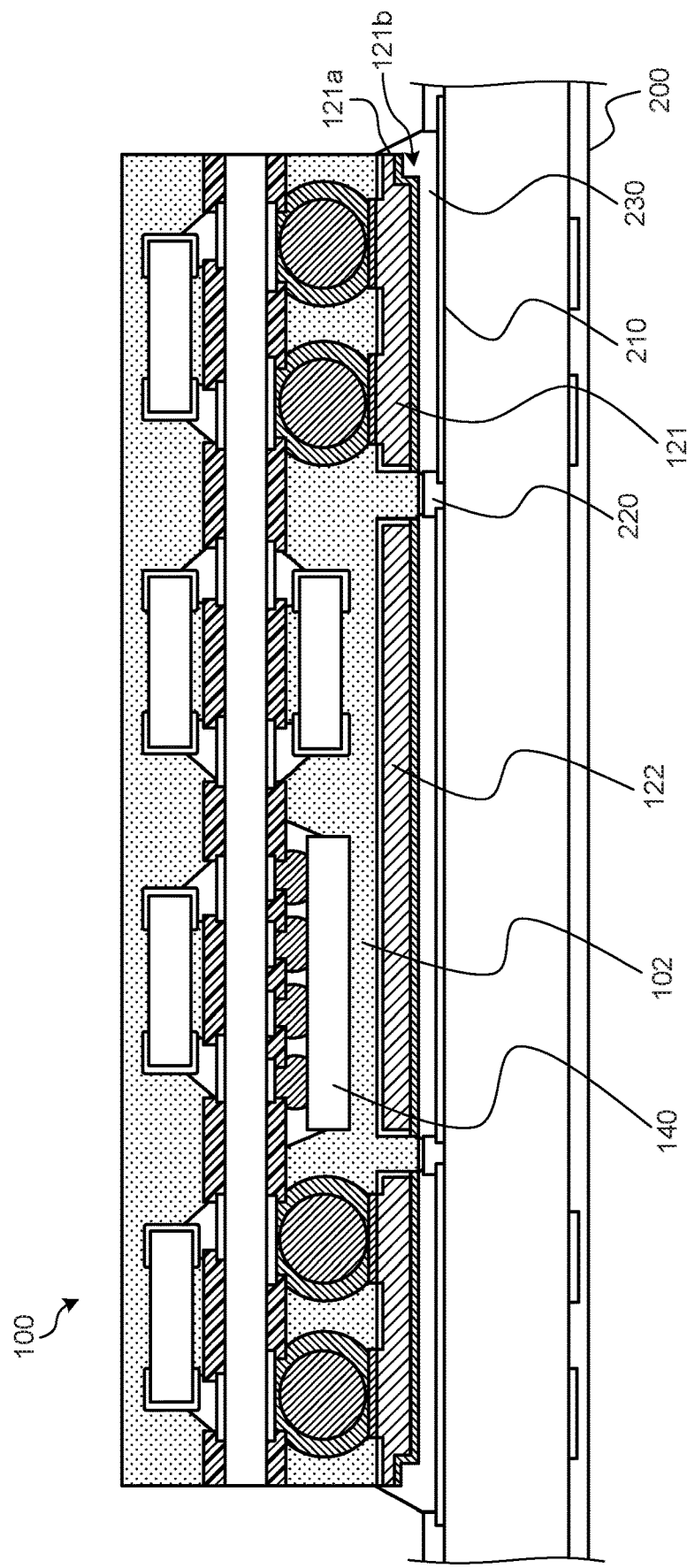
FIG. 24 is a diagram for explaining mounting of the semiconductor device.

Each of the semiconductor devices 100 obtained by the singulating can be mounted on the mounting substrate. Specifically, with the leads 121 of the lead frame 120 as terminals, each of the semiconductor devices 100 can be mounted on the mounting substrate. FIG. 24 is a diagram for explaining mounting of the semiconductor device 100.

As illustrated in FIG. 24, on a wiring layer of an upper surface of a mounting substrate 200, pads 210 are formed, and the pads 210 are exposed from openings of a solder resist layer 220. When the semiconductor device 100 is mounted on the mounting substrate 200, positioning of the leads 121 and the heat sink 122 of the semiconductor device 100 and the pads 210 of the mounting substrate 200 is conducted, and the leads 121, the heat sink 122, and the pads 210 are joined by solder 230. At this time, since in an end portion of a lower surface of each of the leads 121, a step constituted of a groove 121b is present, wet-spreading of the solder 230 is promoted and a fillet of the solder 230 covers a side surface 121a of each of the leads 121. As a result, the semiconductor device 100 is tightly joined to the mounting substrate 200, thereby allowing reliability of connection to be enhanced. In a state illustrated in FIG. 24, heat generated by the IC chip 140 is conducted via the encapsulating resin 102 to the heat sink 122 and is dissipated from the heat sink 122 via the solder 230 and the pads 210. In other words, the heat can be efficiently dissipated from a large part of a surface area of the IC chip 140.

As described above, according to the present embodiment, the IC chip is mounted between the wiring substrate, which is connected by the connection members, and the lead frame, the heat sink of the lead frame is disposed in the position opposed to the IC chip, and the encapsulating resin is filled in the space between the wiring substrate and the lead frame. The leads of the lead frame are exposed from the encapsulating resin to constitute the terminals for external connection. Therefore, the heat generated by the IC chip is conducted to the heat sink via the encapsulating resin around the IC chip and is dissipated from the heat sink. As a result, the dissipation efficiency of the semiconductor device can be enhanced.

Figure 25:
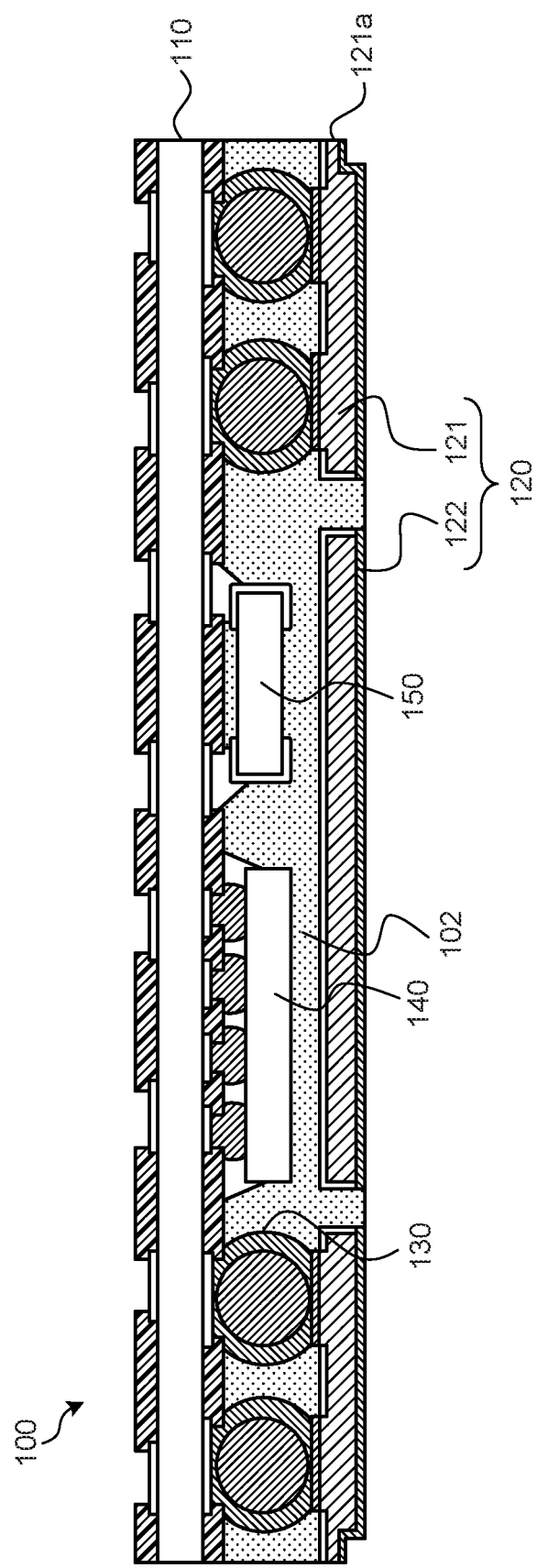
FIG. 25 is a diagram illustrating a modified example of the semiconductor device.

It is to be noted that although in the above-described one embodiment, the electronic components 103 are mounted on the upper surface of the wiring substrate 110, mounting of the electronic components 103 on the upper surface of the wiring substrate 110 and encapsulating by the encapsulating resin 101 may be omitted. In other words, for example, as illustrated in FIG. 25, no electronic components may be disposed on the upper surface of the wiring substrate 110 of the semiconductor device 100, and only the IC chip 140 and the electronic component 150 which are encapsulated by the encapsulating resin 102 may be disposed between the wiring substrate 110 and the lead frame 120. In addition, also when the electronic components 103 are mounted on the upper surface of the wiring substrate 110, encapsulating by the encapsulating resin 101 may be omitted. In this case, the semiconductor device 100 has the electronic components 103 which are mounted on the upper surface of the wiring substrate 110 and are exposed.

Figure 26:
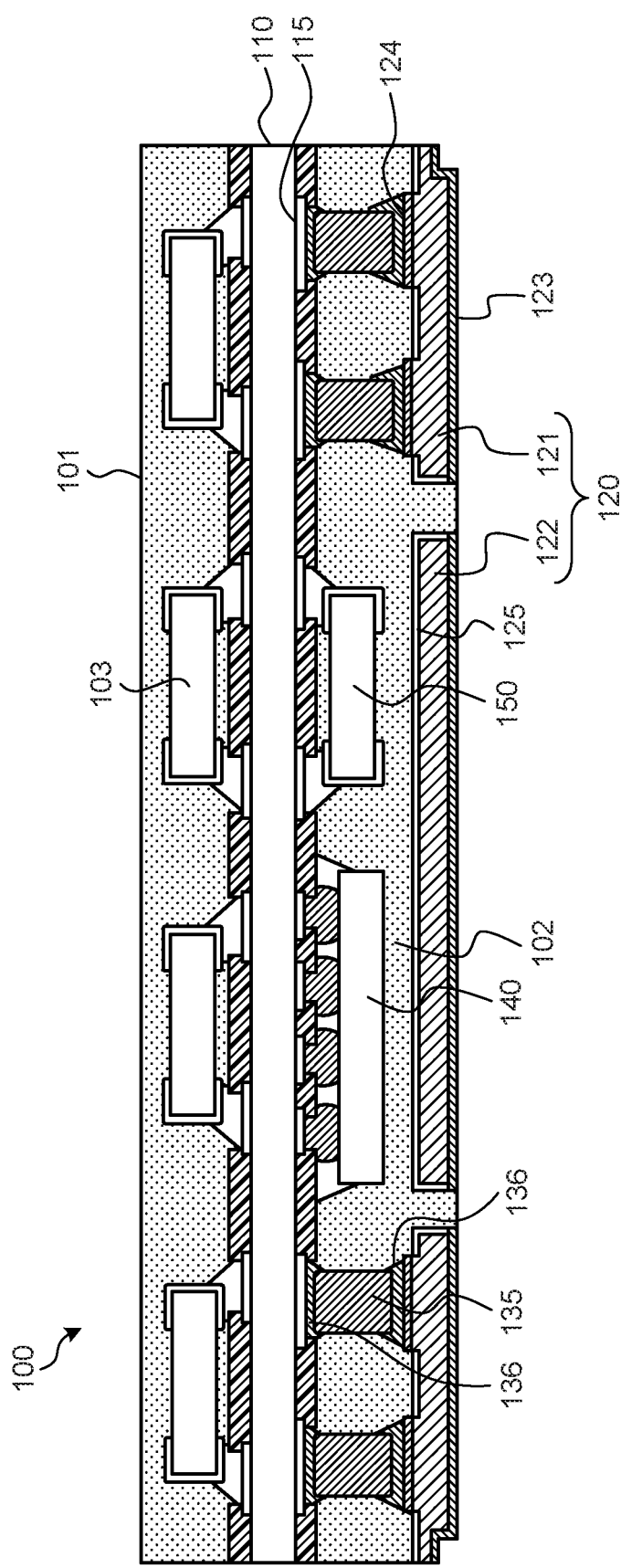
FIG. 26 is a diagram illustrating another modified example of the semiconductor device.

In addition, although in the above-described one embodiment, each of the connection members 130 is the solder ball having, for example, the copper core and each of the cores 131 is of the substantially spherical shape, a shape of each of the connection members 130 may be of any shape. Specifically, for example, as illustrated in FIG. 26, connection members 135, each of which is formed of metal such as copper or a copper alloy in a columnar shape or a prismatic shape, may be joined to the lower surface pads 115 of the wiring substrate 110 and the plated layer 124 of the lead frame 120 by solder 136. Each of the connection members 135 is formed to be of the columnar shape or the prismatic shape, whereby respective upper and lower end surfaces of each of the connection members 135 are joined to each of the lower surface pads 115 and the plated layer 124, a joining area is made large, and reliability can be enhanced.

Figure 27:
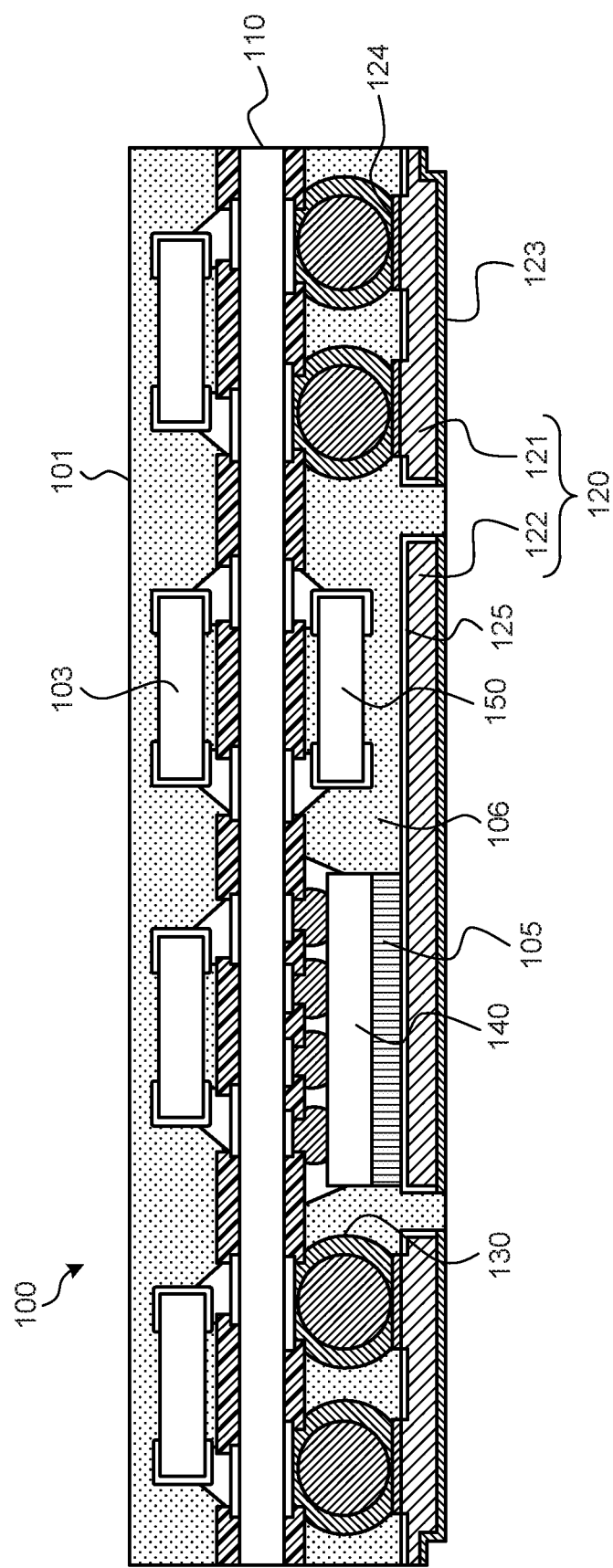
FIG. 27 is a diagram illustrating still another modified example of the semiconductor device.

Furthermore, although in the above-described one embodiment, the encapsulating resin 102 is filled in the space between the wiring substrate 110 and the lead frame 120, for example, as illustrated in FIG. 27, a thermal interface material (TIM) 105 may be disposed in the space between the IC chip 140 whose amount of heat generation is large and the heat sink 122, and normal encapsulating resin 106 may be filled in the space between the wiring substrate 110 and the lead frame 120. As the TIM 105, a material in which a filler such as alumina, silica, aluminum nitride, or silicon carbide or a metal filler such as silver is contained in, for example, insulating resin such as epoxy resin and polyimide resin can be used, and as the encapsulating resin 106, resin similar to the encapsulating resin 101 can be used.

In addition, although in the above-described one embodiment, the IC chip 140 is mounted on the lower surface of the wiring substrate 110, the IC chip 140 can be mounted on the upper surface of the lead frame 120. In this case, for example, as illustrated in FIG. 28, in a position where the IC chip 140 is mounted, leads 126 are formed. On an upper surface of each of the leads 126, a plated layer 127 similar to the plated layer 124 is formed, and the IC chip 140 is flip-chip connected to the plated layer 127 by solder bumps 143. On a surface of each of the leads 126 contacting the encapsulating resin 102, the oxide film 125 is formed, and on a lower surface of each of the leads 126 exposed from the encapsulating resin 102, the plated layer 123 is formed, as with the leads 121. In this configuration, heat generated by the IC chip 140 is dissipated via the solder bumps 143, the plated layer 127, and the leads 126. In addition, not only the IC chip 140 but also the electronic component 150 can be mounted on the upper surface of the lead frame 120.

Other Embodiments (1) Plated Layer

In the above-described one embodiment, the plated layer 124 is formed on the lead frame 120, the oxide film 125 is formed around the plated layer 124, thereby making the positioning of the lead frame 120 and the connection members 130 accurate. However, since the oxide film 125 reduces the active force of the flux, wet-spreading of the solder 132 can be controlled even without the plated layer 124 and the positioning of the connection members 130 can be made accurate. Here, a method for manufacturing a lead frame 120 having no plated layer 124 will be described with reference to FIGS. 29A to 29D.

As in the above-described one embodiment, for manufacturing a lead frame 120, a metal plate of copper or a copper alloy having a thickness of, for example, approximately 50 µm to 200 µm can be used. As illustrated in FIG. 29A, leads 121 and a heat sink 122 are formed by etching or press working of the metal plate. As illustrated in FIG. 29B, an oxide film 125 is formed on surface of the leads 121 and the heat sink 122 by anodizing of the lead frame 120. In other words, on all surfaces of the leads 121 and the heat sink 122, the oxide film 125 is formed.

As illustrated in FIG. 29C, in positions 125a joined to connection members 130 of the leads 121, the oxide film 125 is removed. The removal of the oxide film 125 can be conducted by, for example, laser machining, blast machining, or the like. In the positions 125a, a base material of the lead frame 120 is exposed by the removal of the oxide film 125. As illustrated in FIG. 29D, in each of the positions 125a, each of the connection members 130 is mounted and is subjected to a reflow process. As this time, if flux applied to the positions 125a flows out to the oxide film 125 therearound, the oxide film 125 is reduced and an active force of the flux is thereby lowered. Therefore, solder 132 of the connection members 130 does not wet-spread to peripheries of the positions 125a, thereby allowing positioning of the connection members 130 to be made accurate.

As described above, even when the plated layer 124 is not formed on the leads 121, by utilizing the oxide film 125, the positioning of the lead frame 120 and the connection members 130 can be made accurate. In addition, since a step of forming the plated layer 124 can be omitted, a step of manufacturing the lead frame 120 can be simplified.

(2) Underfill Material

Figure 30:
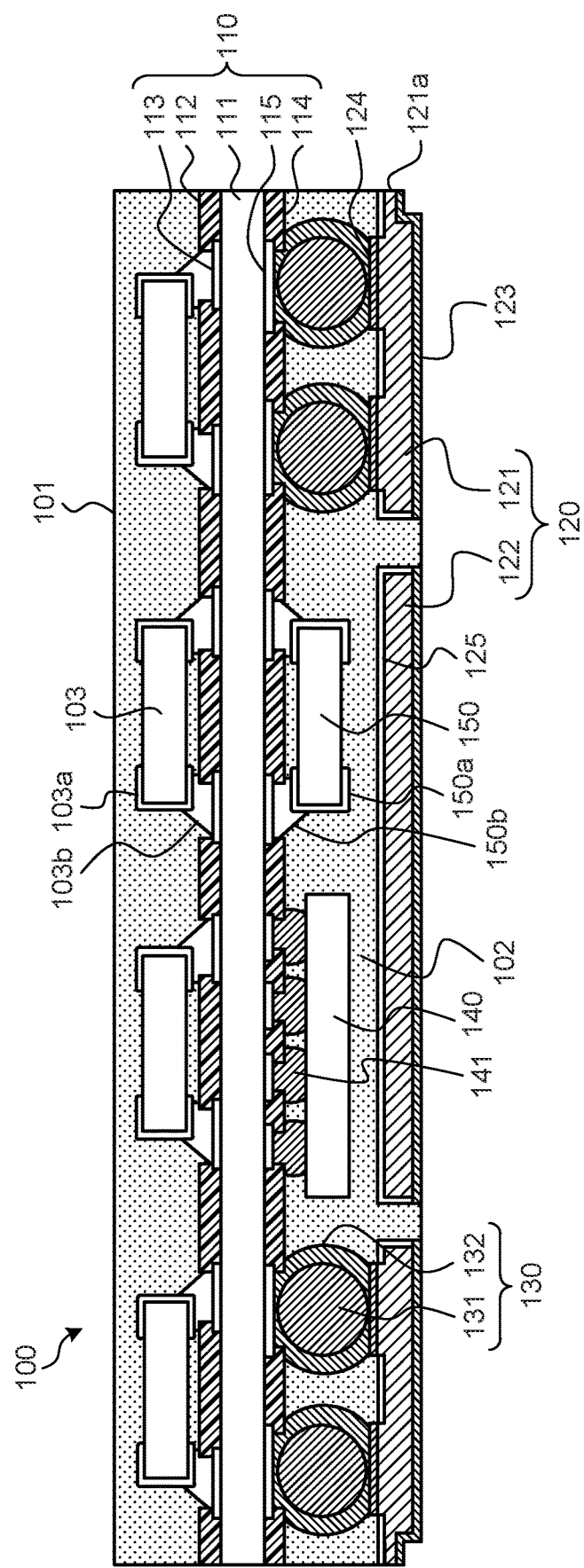
FIG. 30 is a schematic view illustrating a cross section of a semiconductor device according to the other embodiment.

Although in the above-described one embodiment, between the lower surface of the wiring substrate 110 and the IC chip 140, the underfill material 142 is filled, the underfill material 142 may not necessarily be filled therebetween. Specifically, for example, as illustrated in FIG. 30, between an IC chip 140 flip-chip connected to a lower surface of a wiring substrate 110 by solder bumps 141 and the lower surface of the wiring substrate 110, no underfill material may be filled. Since encapsulating resin 102 is filled in a space between the wiring substrate 110 having the IC chip 140 mounted thereon and a lead frame 120, even when filling of the underfill material is omitted, the encapsulating resin 102 is filled in the space between the IC chip 140 and the wiring substrate 110. As a result of this, the IC chip 140 does not fall off from the wiring substrate 110, and reliability of connection of the IC chip 140 is not reduced.

The of the underfill material is omitted, thereby allowing a step of manufacturing a semiconductor device 100 to be simplified and enabling manufacturing costs to be reduced. In addition, since the underfill material does not spread around the IC chip 140, an area of a region of the lower surface of the wiring substrate 110, where the IC chip 140 is mounted, can be made small, thereby allowing the surface of the wiring substrate 110 to be effectively utilized. In other words, it is made possible to mount a further large number of electronic components in a narrow range, thereby allowing the semiconductor device 100 to be miniaturized and enabling a degree of freedom of designing to be enhanced.

It is to be noted that although herein, the case in which the filling of the underfill material is omitted upon mounting the IC chip 140 is described, besides the IC chip 140, for example, filling of the underfill material between the electronic components mounted on the wiring substrate 110 by the flip-chip connection and the wiring substrate 110 may be omitted. In addition, since also the electronic components mounted on the upper surface of the wiring substrate 110 are covered by the encapsulating resin 101, the filling of the underfill material can be omitted.

Figure 31:
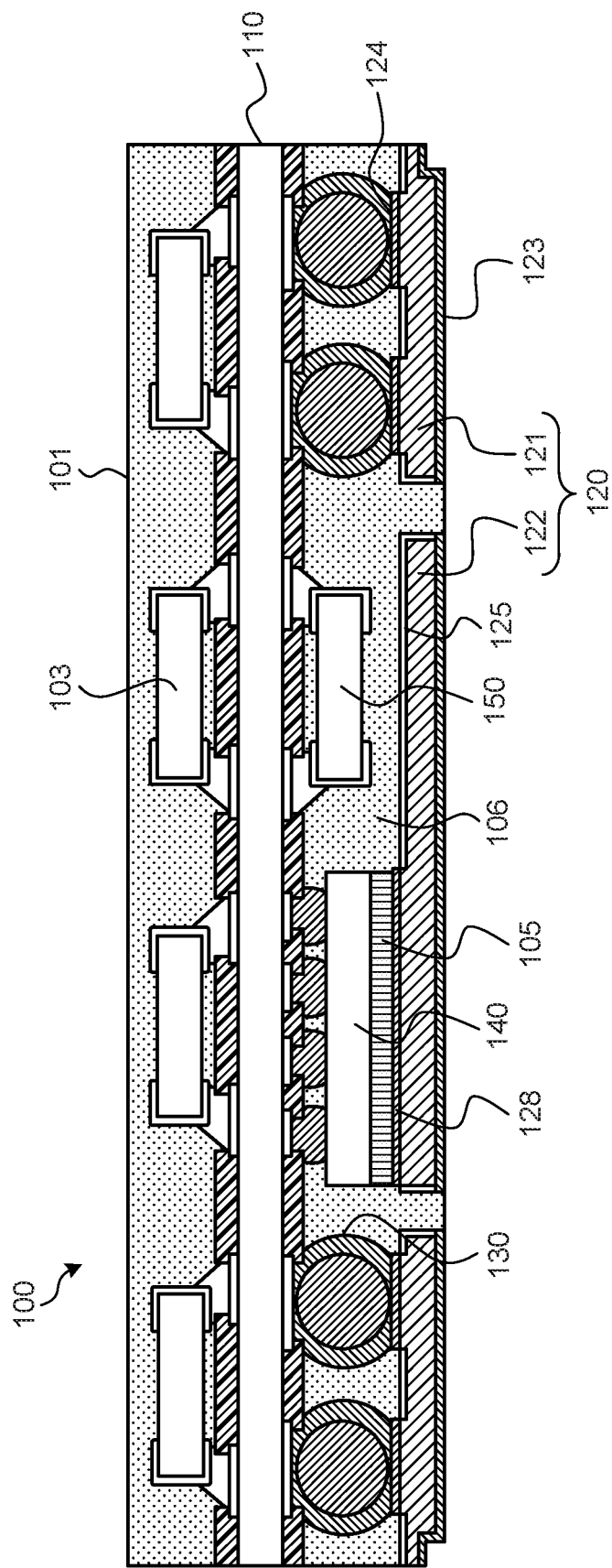
FIG. 31 is a schematic view illustrating a semiconductor device according to the other embodiment.

Also when the filling of the underfill material is omitted, for example, as illustrated in FIG. 31, a TIM 105 sandwiched between the IC chip 140 and the heat sink 122 may be disposed, and normal encapsulating resin 106 may be filled in the space between the wiring substrate 110 and the lead frame 120. Thus, heat generated by the IC chip 140 whose amount of heat generation is large is transmitted via the TIM 105 to the heat sink 122, thereby enabling efficient dissipation. At this time, in a position corresponding to the TIM 105 on the upper surface of the heat sink 122, a plated layer 128 may be formed. The plated layer 128 is formed by, for example, noble metal plating such as silver (Ag) plating. In other words, the plated layer 128 is formed of plating similar to the plated layer 124.

Since a roughening degree of a surface of the plated layer 128 is low and the surface thereof is flat, as compared with a surface of the oxide film 125 therearound, the TIM 105 contacts the plated layer 128, thereby allowing a thickness of the TIM 105 to be made even, as compared with a case in which the TIM 105 contacts the oxide film 125. As a result of this, the thickness of the TIM 105 disposed between the IC chip 140 and the heat sink 122 becomes even, thereby allowing the heat generated from the IC chip 140 to be efficiently conducted to the heat sink 122.

The plated layer 128 may be formed concurrently when the plated layer 124 is formed on upper surfaces of the leads 121. In other words, the plated layer 128 may be formed in a position opposed to the IC chip 140 concurrently when the plated layer 124 is formed in a position opposed to each of the lower surface pads 115c. High thermal conductivity resin in a semi-cured state, which is applied to a back surface of the IC chip 140 by dispensing, printing, or the like, is cured when the wiring substrate 110 and the lead frame 120 are joined, thereby forming the TIM 105. It is to be noted that the high thermal conductivity resin constituting a material of the TIM 105 may be applied to a front surface of the plated layer 128, instead of being applied to the back surface of the IC chip 140.

(3) Steps of Outer Edges of Lead Frame

Figure 32:
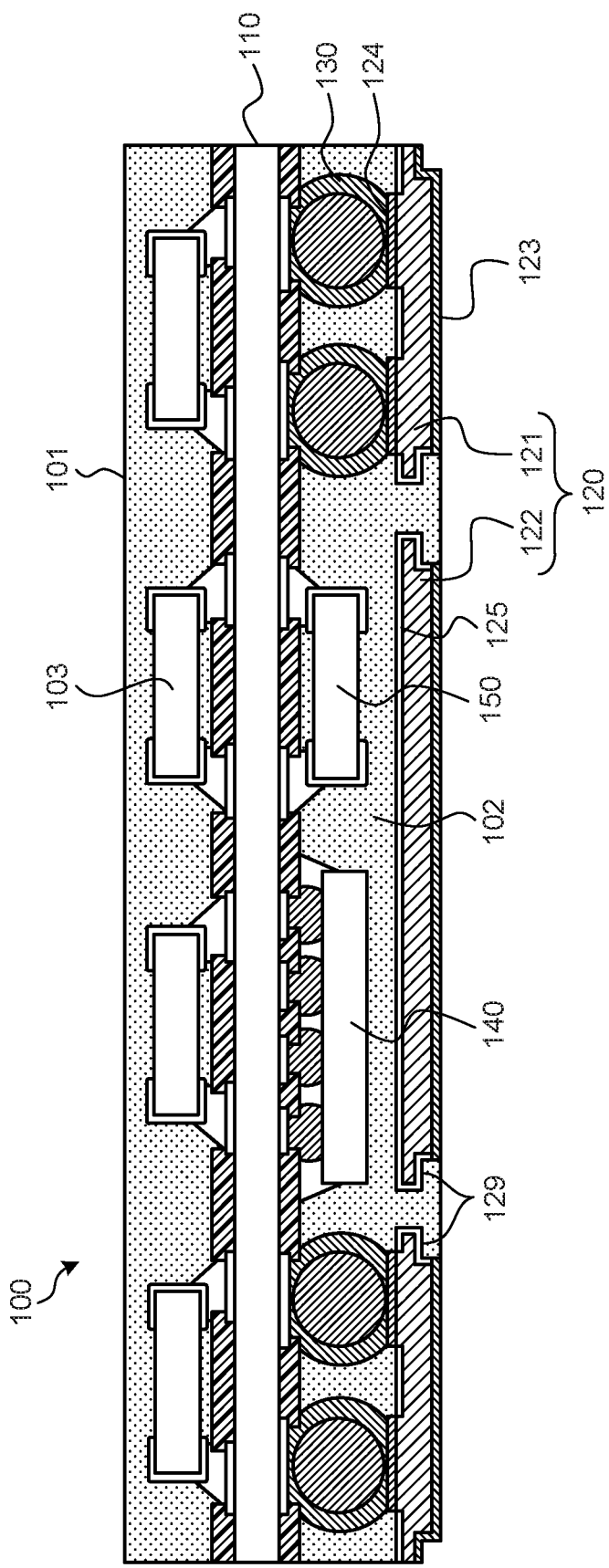
FIG. 32 is a schematic view illustrating a cross section of a semiconductor device according to the other embodiment.

Although in the above-described one embodiment, the steps are formed in the end portions of the lower surface of the lead frame 120, the steps may be formed in portions other than the end portions. Specifically, for example, as illustrated in FIG. 32, step surfaces 129 may be formed around each of leads 121 and a heat sink 122. Thus, encapsulating resin 102 is filled below the step surfaces 129 of each of the leads 121 and the heat sink 122, and the step surfaces 129 are covered by the encapsulating resin 102. As a result of this, a lead frame 120 is tightly joined to a semiconductor device 100, thereby allowing falling-off of the lead frame 120 or the like to be prevented. Herein, a method for manufacturing the lead frame 120 in which the step surfaces 129 are formed around each of the leads 121 and the heat sink 122.

Figure 33:
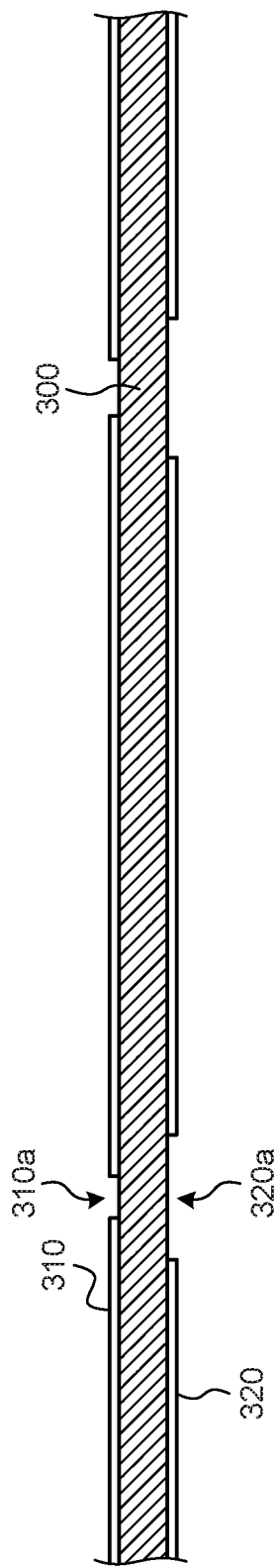
FIG. 33 is a diagram for explaining a step of forming etching resists.

As in the above-described one embodiment, for manufacturing a lead frame 120, a metal plate of copper or a copper alloy having a thickness of, for example, approximately 50 µm to 200 µm can be used. As illustrated in FIG. 33, on an upper surface a lower surface of a metal plate 300, an etching resist is formed. In other words, on the upper surface of the metal plate 300, an etching resist 310 is formed, and on the lower surface thereof, an etching resist 320 is formed. These etching resists 310 and 320 are formed positions which are left as positions for the leads 121 and the heat sink 122. In other words, in portions which are not left as the positions for the leads 121 or the heat sink 122 of the metal plate 300, voids of the etching resist are formed. Specifically, on the upper surface of the metal plate 300, voids 310a are formed, and on the lower surface thereof, voids 320a are formed. Here, a width of each of the voids 320a on the lower surface is wider than a width of each of the voids 310a on the upper surface.

Figure 34:
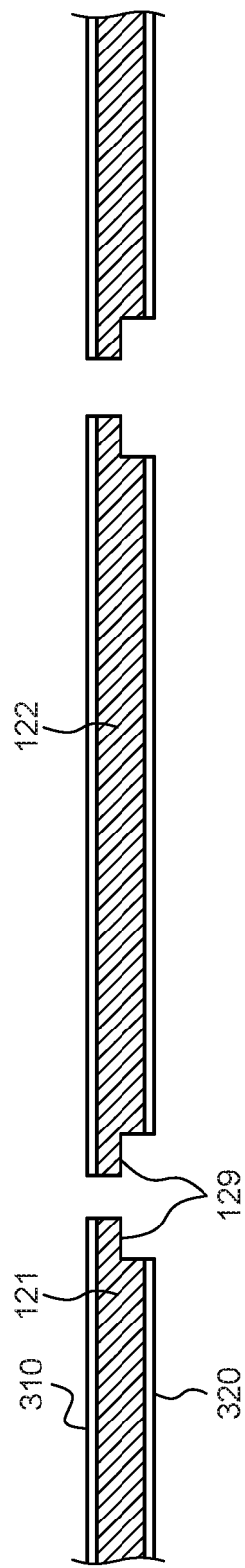
FIG. 34 is a diagram for explaining an etching step.

By immersing the metal plate 300, in which the etching resists as mentioned above are formed, in etching liquid, the metal plate 300 exposed in the voids 310a and 320a is dissolved from the surfaces, and for example, as illustrated in FIG. 34, the lead frame 120 in which the leads 121 and the heat sink 122 are separated is formed. Since the width of each of the voids 320a on the lower surface is made wider than the width of each of the voids 310a on the upper surface, in a region of each of the voids 320a on the lower surface, which overlaps each of the voids 310a on the upper surface, the metal plate 300 is dissolved from the upper surface and the lower surface, the leads 121 and the heat sink 122 are completely separated. On the other hand, in a region of each of the voids 320a on the lower surface, which does not overlap each of the voids 310a on the upper surface, the metal plate 300 is dissolved only from the lower surface, whereby the step surfaces 129 are formed.

Figure 35:
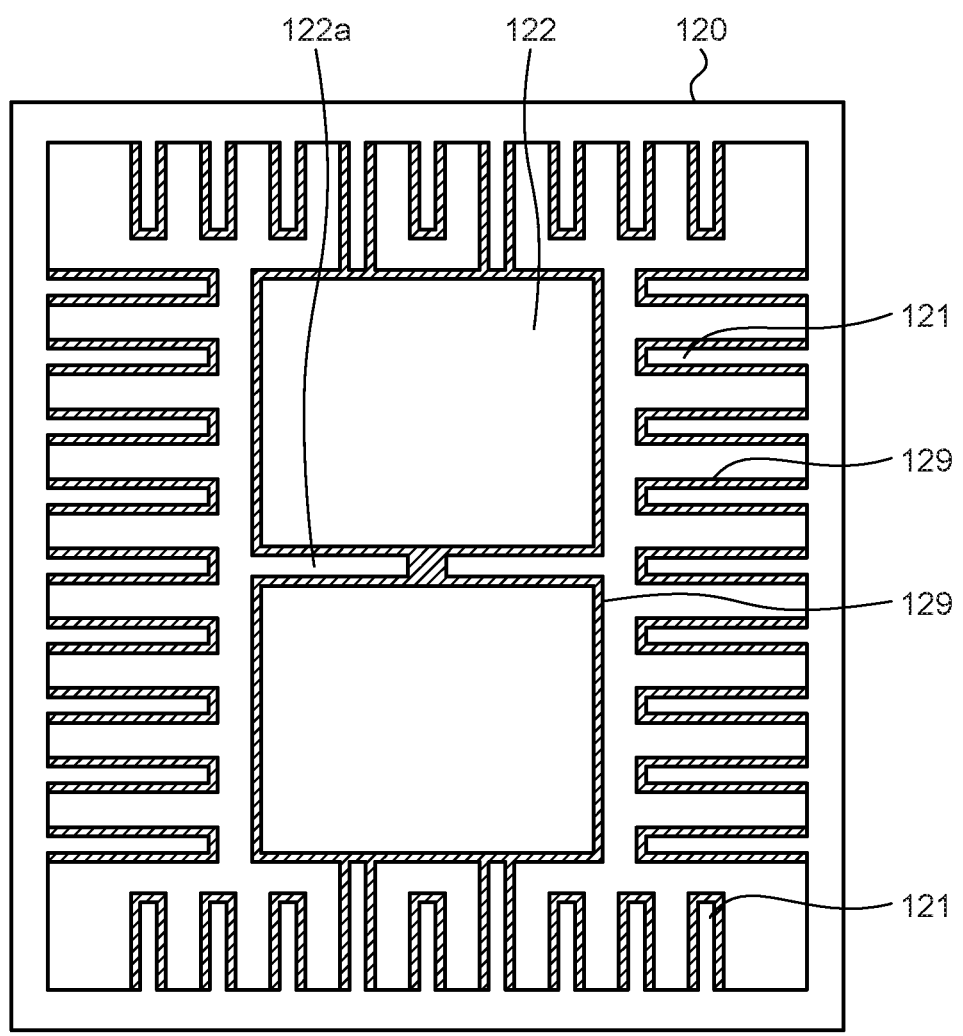
FIG. 35 is a bottom view illustrating a configuration of a lead frame according to the other embodiment.

As described above, by forming the etching resists whose widths are different from each other on the upper surface and the lower surface of the metal plate 300 and immersing the metal plate 300 in the etching liquid, the lead frame having the step surfaces 129 on outer edges of each of the leads 121 and the heat sink 122 can be formed. In other words, for example, as illustrated in FIG. 35, in outer edge portions of each of the leads 121 and the heat sink 122, indicated by oblique lines, the step surfaces 129 can be formed. The lead frame 120 having the step surfaces 129 is joined to the wiring substrate 110, and when the encapsulating resin 102 is filled in the space between the wiring substrate 110 and the lead frame 120, the encapsulating resin 102 is filed also below the step surfaces 129 and supports the lead frame 120, thereby allowing falling-off of the lead frame 120 from the semiconductor device 100 to be prevented.

According to one aspect of a semiconductor device and a method for manufacturing a semiconductor device, which the present application discloses, effect to allow a dissipation efficiency to be enhanced is exhibited.

In regard to the above embodiments, the following note is also disclosed.

(Note) A method for manufacturing a semiconductor device, the method comprising:
  disposing an electronic component between a lead frame formed of metal and a wiring substrate opposed to the lead frame;
  joining the lead frame and the wiring substrate by a connection member; and
  filling a encapsulating resin between the lead frame and the wiring substrate and covering the electronic component and the connection member, wherein
  the covering includes:
  covering, by the encapsulating resin, a first surface of the lead frame opposed to the wiring substrate;
  exposing, from the encapsulating resin, a second surface located on a back side of the first surface of the lead frame; and
  exposing, from the encapsulating resin, at least a portion of a side surface neighboring the first surface or the second surface of the lead frame.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a lead frame including a lead that has a first end and a second end opposite to the first end;
a wiring substrate that is provided on the lead frame;
an electronic component that is provided between the lead frame and the wiring substrate;
a connection member that is provided between the lead frame and the wiring substrate and connects the lead frame and the wiring substrate; and
an encapsulating resin that is filled between the lead frame and the wiring substrate and covers the electronic component and the connection member, wherein
the lead includes:
a first surface opposed to the wiring substrate and covered by the encapsulating resin;
a second surface located on an opposite side of the lead than the first surface and exposed from the encapsulating resin;
an end surface of the second end covered by the encapsulating resin; and
an end surface of the first end exposed from a side surface of the encapsulating resin,
the second surface of the lead includes a step formed adjacent to the end surface of the first end and exposed from the encapsulating resin, and
a surface of the encapsulating resin from which the second surface of the lead is exposed includes another step formed adjacent to the step of the second surface of the lead.

2. The semiconductor device according to claim 1, wherein the lead frame includes:
a heat sink including a heat sink first surface which is opposed to the electronic component.

3. The semiconductor device according to claim 2, further comprising a heat transmitting member that is sandwiched between the heat sink and the electronic component.

4. The semiconductor device according to claim 3, wherein the heat sink first surface includes a plated layer formed in a position contacting the heat transmitting member.

5. The semiconductor device according to claim 2, wherein
the heat sink includes a heat sink second surface located on an opposite side of the heat sink first surface, and
the heat sink second surface is exposed from the surface of the encapsulating resin and flush with the surface of the encapsulating resin.

6. The semiconductor device according to claim 2, wherein the heat sink is divided by a slit.

7. The semiconductor device according to claim 1, wherein
the lead frame includes a plurality of the lead each of which is connected to the connection member, and
thicknesses of the plurality of the lead are even at portions connected to the connection member.

8. The semiconductor device according to claim 1, wherein the first surface of the lead includes:
a plated layer formed in a position connecting to the connection member; and
an oxide film formed on a periphery of the plated layer and contacting the encapsulating resin.

9. The semiconductor device according to claim 1, wherein the first surface of the lead includes an oxide film formed on a periphery of a position connecting to the connection member and contacting the encapsulating resin.

10. The semiconductor device according to claim 1, wherein the electronic component is connected to the wiring substrate by solder bumps, and the encapsulating resin is filled in a space between the electronic component and the wiring substrate.

11. The semiconductor device according to claim 1, wherein the lead includes a step surface having a second step to the second surface of the lead formed adjacent to the end surface of the second end and covered by the encapsulating resin.

12. The semiconductor device according to claim 1, wherein a side surface of the wiring substrate, the side surface of the encapsulating resin, and the end surface of the first end of the lead are flush with each other.

13. The semiconductor device according to claim 1, wherein the another step is formed adjacent to the side surface of the encapsulating resin.

14. The semiconductor device according to claim 1, wherein the step and the another step are flush with each other.

15. The semiconductor device according to claim 1, wherein the second surface of the lead and the surface of the encapsulating resin are flush with each other.

16. The semiconductor device according to claim 1, wherein
the lead includes a side surface adjacent to the first surface and the second surface,
the first surface and the side surface of the lead are covered by an oxide film and are covered by the encapsulating resin via the oxide film, and
the second surface and the end surface of the first end are exposed from the oxide film and the encapsulating resin.

17. The semiconductor device according to claim 1, wherein the connection member has a core having a spherical shape and a solder covering the core, and connects the lead frame and the wiring substrate via the solder.

18. The semiconductor device according to claim 1, wherein the connection member is pillar-shaped and connects the lead frame and the wiring substrate via a solder disposed at both ends thereof.

19. The semiconductor device according to claim 1, wherein
the lead has a rectangular shape in a top view, and
a width of the connection member is smaller than a width of the lead in a short side direction of the lead.

20. The semiconductor device according to claim 1, wherein a plurality of the connection member is joined to each of at least one of a plurality of the leads.

* * * * *